United States Patent [19]

Horiguchi et al.

[11] Patent Number: 5,528,548
[45] Date of Patent: *Jun. 18, 1996

[54] VOLTAGE CONVERTER OF SEMICONDUCTOR DEVICE

[75] Inventors: Masashi Horiguchi, Kokubunji; Ryoichi Hori, Tokyo; Kiyoo Itoh, Higashikurume; Yoshinobu Nakagome, Hachiouji; Masakazu Aoki, Tokorozawa; Hitoshi Tanaka, Tachikawa, all of Japan

[*] Notice: The term of this patent shall not extend beyond the expiration date of Pat. No. 5,402,375.

[73] Assignees: Hitachi, Ltd.; Hitachi VLSI Engineering Corp., both of Tokyo, Japan

[21] Appl. No.: 384,962

[22] Filed: Feb. 7, 1995

Related U.S. Application Data

[62] Division of Ser. No. 207,679, Mar. 9, 1994, Pat. No. 5,402,375, which is a division of Ser. No. 44,049, Apr. 8, 1993, abandoned, which is a continuation of Ser. No. 790,065, Nov. 12, 1991, Pat. No. 5,272,393, which is a continuation of Ser. No. 274,492, Nov. 22, 1988, abandoned.

[30] Foreign Application Priority Data

Nov. 24, 1987 [JP] Japan .................. 62-294115
Jan. 20, 1988 [JP] Japan .................... 63-8372

[51] Int. Cl.$^6$ .................................................. G11C 7/00
[52] U.S. Cl. ................ 365/226; 365/189.07; 365/189.09
[58] Field of Search ........................... 365/226, 189.09, 365/189.07, 203; 327/63, 306, 408, 543

[56] References Cited

U.S. PATENT DOCUMENTS

| | | | |
|---|---|---|---|
| 4,833,341 | 5/1989 | Watanabe et al. | 307/296.1 |
| 5,272,393 | 12/1993 | Horiguchi et al. | 307/296.6 |
| 5,283,762 | 2/1994 | Fujishima | 365/189.09 |
| 5,402,375 | 3/1995 | Horiguchi et al. | 365/189.09 |

Primary Examiner—Tan T. Nguyen
Attorney, Agent, or Firm—Antonelli, Terry, Stout & Kraus

[57] ABSTRACT

A semiconductor memory is provided which includes a voltage converter supplying an internal supply voltage in proportion to the greater one of two reference voltages to a circuit in the semiconductor memory. The voltage converter includes a circuit which is provided for generating a first voltage whose dependency on an external supply voltage is regulated to a predetermined small value, while another circuit is provided for generating a second voltage whose dependency on the external supplying voltage is larger than the dependency of the first voltage. The voltage converter includes MOS transistors and differential amplifiers interconnected with one another, as well as a voltage dividing circuit. The memory also includes a word line booster for boosting the internal supply voltage.

21 Claims, 16 Drawing Sheets

VOLTAGE CONVERTER OF SEMICONDUCTOR DEVICE

This is a divisional of application Ser. No. 207,679, filed Mar. 9, 1994 now U.S. Pat. No. 5,402,325; which is a divisional of application Ser. No. 044,049 filed Apr. 8, 1993 abandoned; which is a continuation of application Ser. No. 790,065 filed Nov. 12, 1991 (now U.S. Pat. No. 5,272,393); which is a continuation of application Ser. No. 274,492 filed Nov. 22, 1988 (now abandoned).

BACKGROUND OF THE INVENTION

1. Field of the Invention

The present invention relates to semiconductor devices, and particularly to voltage converters which generate an internal supply voltage used at least in some of the circuits of the semiconductor devices.

Moreover, it relates to voltage limiters for lowering an external supply voltage in semiconductor integrated circuit chips and impressing the lowered voltage on small geometry transistors in the chips, and particularly to voltage limiters enabling the attainment of stable output voltage in relation to an external supply voltage subject to a wide range of variation.

2. Description of the Prior Art

In recent years, there has been a problem of the lowering of breakdown voltage accompanying the scaling of semiconductor elements. Although this problem can be solved by lowering supply voltage, this solution is not always preferable for an external interface. Accordingly, it has been proposed to provide a method wherein an internal supply of a lower voltage (e.g. 3 V) than a supply voltage impressed from outside (e.g. 5 V in the case of TTL compatible chips) is prepared in a semiconductor device while the external supply voltage is left unvaried. As to a voltage converter for generating the internal supply from the external supply, a discussion is made, for instance, in Japanese Patent Laid-Open No. 111514/1984 (U.S. application Ser. No. 140,628). The circuit proposed in the aforesaid patent application is shown in FIG. 15(a). This circuit generates an internal supply $V_I$ from an external supply $V_{CC}$. Element R denotes a resistance element, and $BL_0$ and $BL_1$ denote circuits which are called "unit circuits" in the aforesaid patent application. The "unit circuit" is so designed that a channel between B and C FIG. 15(b)) becomes non-continuous when a voltage between A and C is lower than a prescribed voltage (hereinafter called ON-voltage) while becoming continuous when said voltage is the prescribed voltage or above. FIG. 15(b) is an example of realization of the "unit circuit" described in the aforesaid application.

The characteristics of this circuit are shown in FIG. 15(c). When the external supply voltage $V_{CC}$ is $V_{P0}$ ($V_{P0}$ is the ON-voltage of the unit circuit $BL_0$) or below, both $BL_0$ and $BL_1$ are in the non-continuous state, and therefore an output voltage $V_I$ is equal to $V_{CC}$. When $V_{CC}$ exceeds $V_{P0}$, $BL_0$ turns to be in continuity, and therefore $V_I$ is determined by the ratio between the resistance element R and the ON-voltage of $BL_0$. Accordingly the $V_{CC}$ dependency (inclination m) of $V_I$ is smaller than 1 as shown in the figure. When $V_{CC}$ rises and a difference $V_{CC}-V_I$ exceeds $V_{P1}$ ($V_{P1}$ is the ON-voltage of the unit circuit $BL_1$), moreover, $BL_1$ turns to be in continuity, and the ON-resistance $R_1$ of $BL_1$ is connected in parallel to the resistance R. Accordingly, the $V_{CC}$ dependency of $V_I$ (inclination m') becomes larger than $\underline{m}$.

For the $V_{CC}$ dependency of $V_I$, characteristics bent at points P and P' are obtained. Values of $V_{CC}$ at the points P and P' are $$V_o = V_{P0} \tag{1}$$

$$V_0' = V_{P0} + \frac{V_{P1}}{(1-m)} \tag{2}$$

The inclinations $\underline{m}$ and m' are $$m = \frac{R_0}{R+R_0} \tag{3}$$

$$m' = \frac{R_0}{\frac{RR_1}{R+R_1}+R_0} \tag{4}$$

The present circuit is advantageous in that it enables the voltage aging of a circuit operated by the internal supply $V_I$ (hereinafter abbreviated as an internal circuit), as will be described below. The voltage aging is a technique wherein a voltage higher than the one applied in ordinary operation is impressed on a supply terminal before delivery of semiconductor devices so as to exclude therefrom those devices which become imperfect after the voltage is applied, and it is effective for reducing initial imperfections after the delivery. In order to enable the voltage aging of the internal circuit, it is only required to design $V_0$ and $V_0'$ so that the external supply voltage $V_{CC}$ in ordinary operation be found between $V_0$ and $V_0'$ and that $V_{CC}$ in aging be higher than $V_0'$. By such a design as stated above, the operation of the internal circuit is made stable in ordinary operation even when $V_{CC}$ varies, since the $V_{CC}$ dependency $\underline{m}$ of $V_I$ is small therein. On the other hand, $V_I$ higher sufficienctly than in ordinary operation is impressed on the internal circuit in aging and thereby the voltage aging of the internal circuit is implemented, since the $V_{CC}$ dependency m' of $V_I$ is large in aging.

A problem of the above-described prior art is that the characteristics of internal supply in ordinary operation and the characteristics thereof in aging can not be designed independent of each other. In the circuit of FIG. 15(a), for instance, the characteristics in ordinary operation are determined by $BL_0$, and those in aging by $BL_0$ and $BL_1$. When $BL_0$ is altered to modify the characteristics in ordinary operation, therefore, the characteristics in aging are also modified simultaneously. The parameters m' and $V_0'$ determining the characteristics in aging are expressed as $$m' = \frac{R+R_1}{\frac{R_1}{m}+R} \tag{5}$$

$$V_0' = V_0 + \frac{V_{P1}}{1-m} \tag{6}$$

according to equations (1) to (4). As is apparent from these equations, the parameters m' and $V_0'$ determining the characteristics in aging are dependent on $\underline{m}$ and $V_0$ which are parameters determining the characteristics in ordinary operation. Accordingly, it is necessary to redesign $BL_1$ every time when the characteristics in ordinary operation are modified.

FIG. 26 shows a prior-art voltage limiter circuit and an example of an application thereof. This example is described in the Extended Abstracts of the 18th Conference on Solid State Devices and Materials, 1896, pp. 307–310.

The operation thereof will be summarized in the following. In the figure, numeral 1 denotes a semiconductor chip of a voltage generator, VC2 a feedback type voltage limiter circuit formed of a differential amplifier, and L1 and L3 circuits comprising small geometry transistors whose breakdown voltage is low. These circuits are the loads of said voltage limiter circuit, for instance. Mark L2 denotes a circuit comprising a transistor whose size is large and whose breakdown voltage is high. Voltages $VLO_1$ and $VLO_2$ made lower than an external voltage $V_{CC}$ by the voltage limiter with limiter reference voltages VL1 and VL2 used as references are impressed on L1 and L3, respectively. Meanwhile, $V_{CC}$ is impressed directly on L2. Marks $\phi_1$, $\phi_2$ and $\phi_3$ denote driving signals for L1, L2 and L3 respectively. $\phi_1'$ and $\phi_3'$ are signals controlling a current of the differential amplifier in the voltage limiter VC2 and turning a transistor $Q_8$ ON and OFF. These signals are varied from High level ($V_{CC}$) to Low level ($V_{SS}$) at a time point when L1 and L3 start operations in response to $\phi_1$ and $\phi_3$. Thereby the transistor $Q_8$ in VC2 is turned ON and the current of the differential amplifier is increased, so that it can respond at high speed to fluctuations of $VLO_1$ and $VLO_2$ due to current fluctuations of L1 and L3. When L1 and L3 do not operate, on the other hand, said signals are made to be at High level and thereby $Q_8$ is cut off. Thereby the current flowing through the differential amplifier turns to have a value obtained only by $Q_9$. By setting $g_m$ of $Q_8$ to be large and $g_m$ of $Q_9$ to be small, accordingly, a voltage limiter operating at high speed and consuming low power can be realized.

Besides, VC2 comprises two circuits connected to separate loads respectively in the figure, and this is to prevent the fluctuation of an internal supply voltage due to the current fluctuation of one load from affecting the other load.

According to the above-described prior art, the differential amplifier employed in the voltage limiter circuit is so constructed, as shown in FIG. 26, that the P-channel transistors $Q_8$ and $Q_9$ are used as common source loads, N-channel transistors $Q_{12}$ and $Q_{13}$ as active loads and P-channel transistors $Q_{10}$ and $Q_{11}$ as a source-coupled pair and a reference voltage and a limiter output voltage are inputted directly to the gates thereof. In such a construction as described above, however, a gate-source voltage $V_{GS}$ of the source-coupled pair depends on a difference voltage between $V_{CC}$ and VL or VLO, since $Q_8$ and $Q_9$ make the same operations as resistances in a non-saturation region. When the difference between $V_{CC}$ and VL becomes small, in other words, when $V_{CC}$ turns low or VL turns high, therefore, $V_{GS}$ becomes small and a current lessens, which results in the slowdown of a response speed. In the condition of $V_{CC} \leq VL+V_T$, besides, there occurs a problem that $Q_{10}$ and $Q_{11}$ are cut off (discontinue operating as the amplifier). $V_T$ is an absolute value of the threshold voltage of the transistors $Q_{10}$ and $Q_{11}$.

When VL=3(V) and $V_T$=1(V) are substituted as general numerical values in the above expression, then $V_{CC} \leq 4(V)$, and so the circuit does not operate if $V_{CC}$ is a voltage of 4(V) or below. In order to secure operations against the drop of a supply voltage due to a spike current or the like, DRAM for products or the like needs to be so designed as to operate with a voltage as low as $V_{CC}$=3 V approximately. DRAM or the like according to a prior-art system does not operate below $V_{CC}$=4 V, in this relation, and therefore the present circuit is not suitable for practical use.

In addition, the current of the differential amplifier is controlled only at two stages, stages of standby and operation, in the prior art. Moreover, the signal used therefor is not generated on the basis of direct detection of the state of a load, but generated in response to a load driving signal or a clock signal given before or behind said signal. Therefore the current of the differential amplifier needs to be kept large for a longer time than a time required for completion of the operation of the load. Consequently, power consumption is not reduced sufficiently.

SUMMARY OF THE INVENTION

A first object of the present invention is to solve the above-stated problems and to make it possible to design the characteristics of an internal supply in ordinary operation and the characteristics thereof in aging, independent of each other.

A second object of the present invention is to furnish a voltage limiter which operates at high speed even when a supply voltage is equal to an output voltage thereof and further which consumes low power.

In a voltage converter provided in a semiconductor device and supplying an internal supply voltage to at least some circuits of said semiconductor device, the aforesaid first object is attained by providing a circuit which generates a first voltage whose dependency on an external supply voltage is small, a circuit which generates a second voltage whose dependency on the external supply voltage is larger than the first voltage and a selector selecting said first or second voltage. Furthermore, in a semiconductor integrated circuit incorporating therein a voltage limiter provided with a circuit which generates a voltage made lower than the one of an external power supply, a differential amplifier circuit which receives as one input an output of this voltage lowering circuit and amplifies a difference voltage between said input and the other input and a voltage lowering circuit which outputs an internal voltage under the control of an output of said differential amplifier circuit and feeds back this internal supply voltage as the other input to the aforesaid differential amplifier circuit, the aforesaid second object is attained by providing the differential amplifier circuit with an active load of P-channel transistors and with a source-coupled pair of N-channel transistors, or by adding a circuit shifting the level of an input voltage of the voltage limiter in the above-mentioned integrated circuit to said limiter.

The foregoing and other objects, advantages, manner of operation and novel features of the present invention will be understood from the following detailed description when read in connection with the accompanying drawings.

When the semiconductor device is in the state of ordinary operation, an output of a voltage generator used exclusively for ordinary operation serves as an internal supply voltage, according to the above-stated construction. When the device is in the state of testing or aging, an output of a separate voltage generator from the one used in ordinary operation serves as the internal supply voltage, according also to the above construction. By preparing the exclusive voltage generator for each state of operation in this way, each voltage generator can be designed independent of the other. This enables the removal of a disadvantage that the characteristics in ordinary operation affect those in aging, which is the problem in the previously-described prior art, for instance.

The problem of the reduction of power consumption of the aforesaid voltage limiter is solved by providing two or more current controlling transistors for the differential amplifier and further by providing a circuit detecting the amount of lowering of an output voltage of the voltage limiter and controlling the aforesaid current controlling transistors on the basis of the detection.

Moreover, by inserting a level shift circuit in an input terminal of the differential amplifier so as to lower a voltage impressed on the input terminal of the differential amplifier, by the amount of $V_T$ of the transistors of the source-coupled pair or by the amount of a voltage lower than $V_T$, a gate-source voltage $V_{GS}$ of the transistors of the source-coupled pair is secured to be $V_T$ or above even when a supply voltage and the output voltage of the limiter turn equal to each other.

Furthermore, by using N-channel transistors for the source-coupled pair transistors of the differential amplifier, the effect of $V_{CC}$ is removed, since $V_{GS}$ of the source-coupled pair transistors turns to be determined on the basis of $V_{SS}$ as a reference. Accordingly, operations can always be conducted irrespective of a value of $V_{CC}$ on condition that a reference voltage VL is $V_T$ or above.

By using the two methods described above, the voltage limiter can operate even when the supply voltage and the output voltage are equal to each other, since $V_{GS}$ of the source-coupled pair transistors thereof is secured to be $V_T$ or above.

By providing two or more current controlling transistors of the differential amplifier, besides, a current value can be controlled more finely, and therefore a wasteful current can be reduced, thus the attainment of power reduction being enabled. Moreover, by providing the circuit detecting the amount of lowering of the output voltage of the voltage limiter and generating a current control signal automatically in accordance with this amount, a current can be made large only for a period when the current flows actually to a load, and therefore a wasteful current can be eliminated. By combining the two means, in addition, fine control can be conducted momentarily for a change in the current of the load, and therefore a further power reduction can be attained.

The foregoing and other objects, advantages, manner of operation and novel features of the present invention will be understood from the following detailed description when read in connection with the accompanying drawings.

DETAILED DESCRIPTION OF THE PREFERRED EMBODIMENTS

Embodiments of the present invention will be described hereunder with reference to the drawings. Although the following description will be made on the case wherein the external supply voltage $V_{CC}$ is positive, the present invention can be applied also to the case wherein $V_{CC}$ is negative, by reversing the polarity and others of transistors.

Figure 1A:
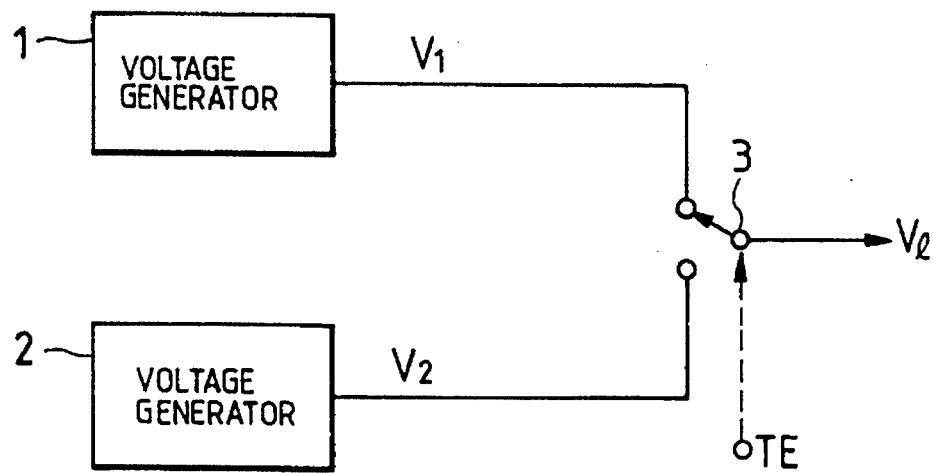
FIGS. 1 to 3 are structural views of voltage converters being embodiments of the present invention and graphs showing the characteristics thereof.

FIG. 1(a) is a structural view of a voltage converter which is a first embodiment of the present invention. In the figure, numerals 1 and 2 denote voltage generators, and 3 a selector. One of outputs $V_1$ and $V_2$ of the two voltage generators 1 and 2 is selected to be an output voltage $V_I$ by the selector 3. Out of the outputs of the two voltage generators, $V_1$ has small dependency on the external supply voltage $V_{CC}$, in other words, it is stable in relation to $V_{CC}$. In contrast, $V_2$ has relatively large dependency on $V_{CC}$. The selector 3 is controlled by a signal TE showing whether the semiconductor device is in the state of ordinary operation or in the state of testing. $V_1$ is selected to be $V_I$ when the device is in the state of ordinary operation, while $V_2$ is selected to be same when the device is in the state of testing.

Figure 1B:
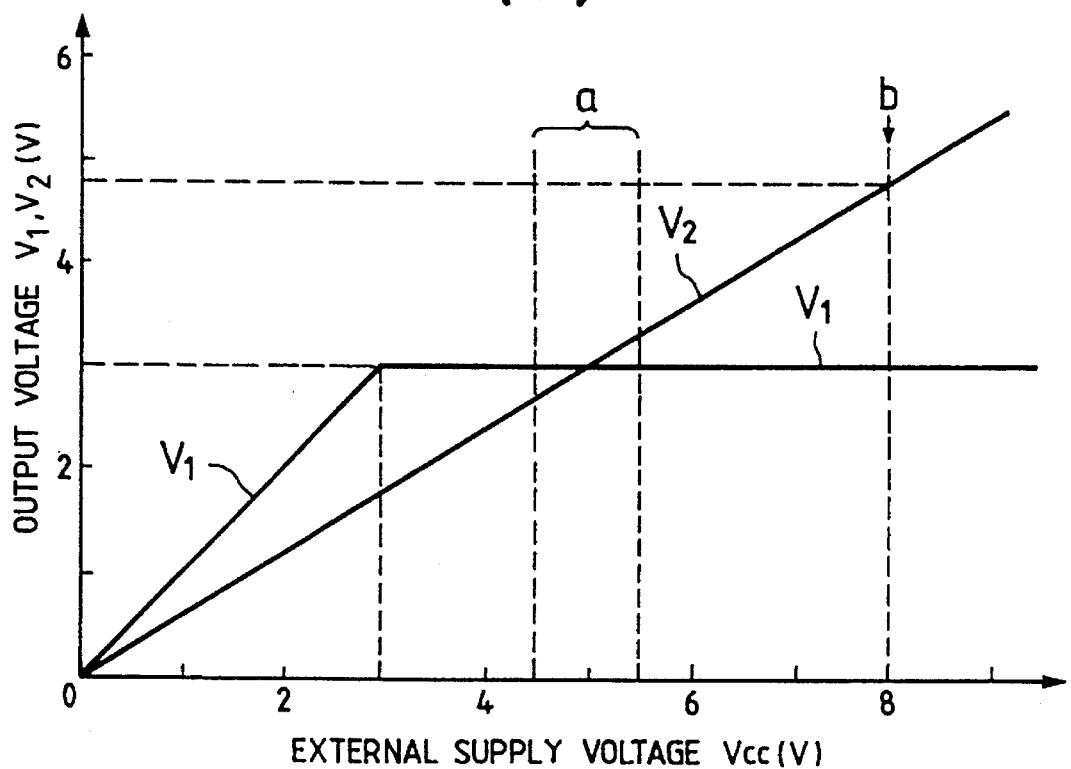

The characteristic features of this circuit lie in that the dependency of the operation of an internal circuit on the internal supply voltage can be tested and that the voltage aging of the internal circuit can be executed. FIG. 1(b) shows one example of the $V_{CC}$ dependency of the voltage of each element of this circuit. This is an example wherein the external supply voltage $V_{CC}$=5± 0.5 V (denoted by a in the figure) and the internal supply voltage $V_I$=3 V in ordinary operation and wherein the external supply voltage $V_{CC}$=8 V (denoted by b in the figure) and the internal supply voltage $V_I$=4.8 V in aging. $V_1$ has small $V_{CC}$ dependency and is almost fixed substantially (it is 3 V herein, provided that $V_1$=$V_{CC}$ when $V_{CC}$<3 V). On the other side, $V_2$ rises monotonously in accordance with $V_{CC}$ ($V_2$=0.6 $V_{CC}$ herein). Since $V_I$=$V_1$ in ordinary operation, the stabilized internal supply voltage (=3 V) is impressed on the internal circuit, and thereby the operation of the internal circuit is stabilized. Since $V_I$=$V_2$ in the state of testing, on the other side, the internal supply voltage to be impressed on the internal circuit can be varied by varying $V_{CC}$. While it is difficult to test the dependency of the operation of the internal circuit on the supply voltage in the prior-art voltage converter, since the stabilized voltage is always impressed on the internal circuit therein, the test becomes possible according to the present circuit, and in addition, a design with a margin for fluctuations of the internal supply voltage can be made, since the internal supply voltage in ordinary operation is stabilized. In order to conduct the voltage aging of the internal circuit according to the present circuit, it is only required to turn $V_{CC}$ to be an aging voltage (8 V in this example) in the state of testing. The device being in the state of testing, $V_I$=$V_2$ (=4.8 V), and therefore a higher internal supply voltage than in ordinary operation is impressed on the internal circuit.

As is apparent from the above description, the voltage generator 1 for ordinary operation needs to meet only the characteristics in the state of ordinary operation, while the voltage generator 2 for testing needs to meet only the characteristics in the state of testing. In other words, the generators 1 and 2 can be designed independent of each other.

In the present embodiment, outputs of two voltage generators are selected to be the internal supply voltage. A design may also be adopted, in this connection, wherein outputs of three or more voltage generators are selected. This is effective in the case when the internal circuit is tested in a plurality of conditions, for instance.

Figure 2A:
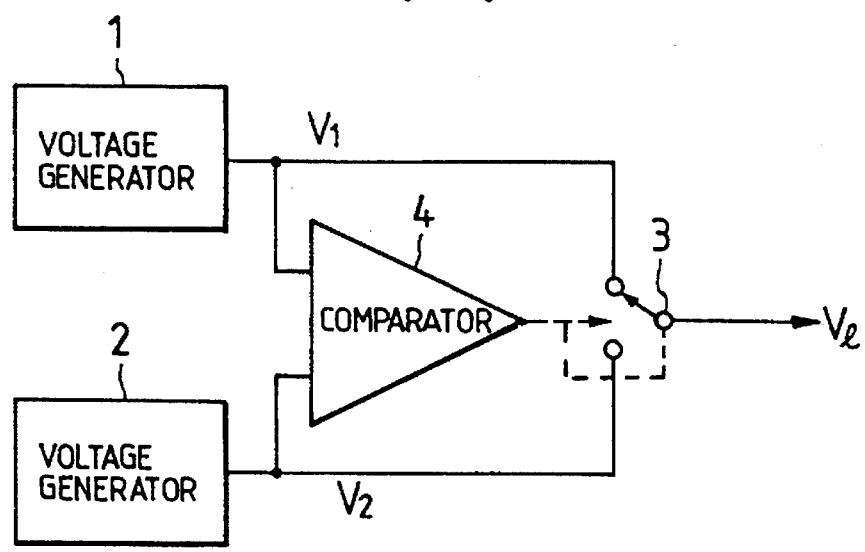

FIG. 2(a) is a structural view of a voltage converter which is a second embodiment of the present invention. This embodiment differs from the embodiment of FIG. 1 in that a selector 3 is controlled by an output of a comparator 4. The comparator 4 compares the output $V_1$ of the voltage generator for ordinary operation with the output $V_2$ of the voltage generator for aging and controls the selector 3 so that the higher voltage be selected.

Figure 2B:
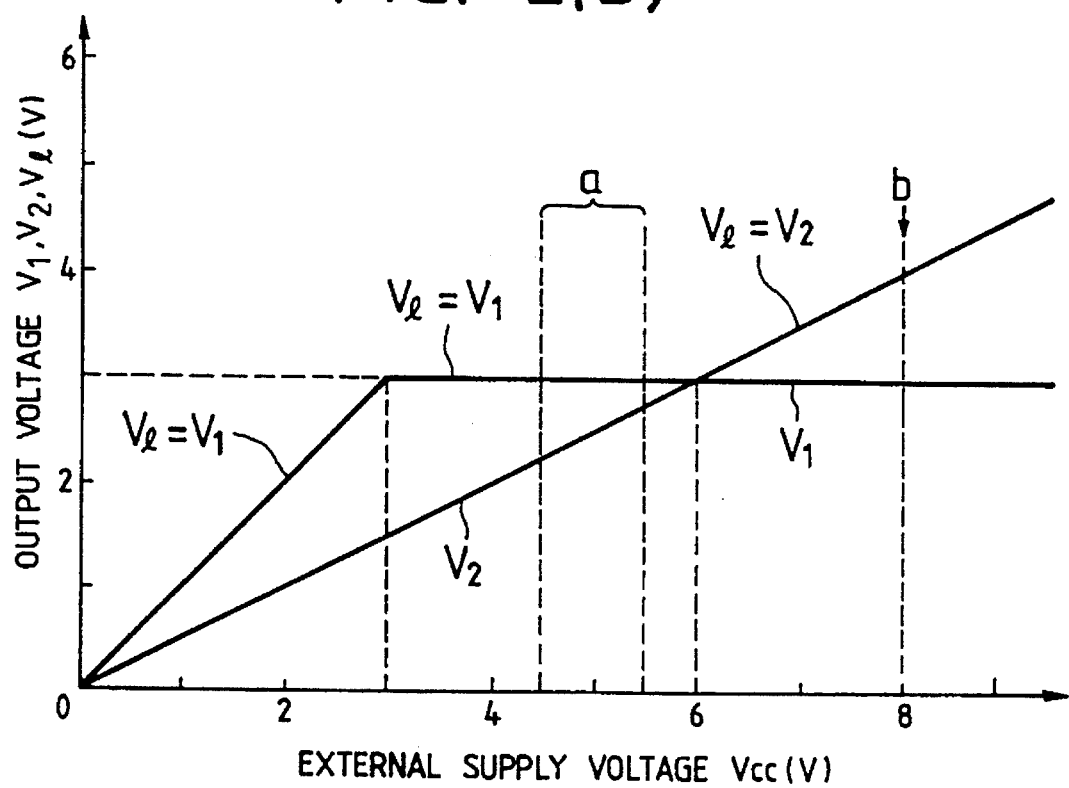

The characteristic feature of this circuit lies in that an internal supply having the characteristics enabling the voltage aging of the internal circuit can be obtained without applying such a control signal as TE of FIG. 1. FIG. 2(b) shows one example of the $V_{CC}$ dependency of the voltage of each element of this circuit. This example shows the cases when the external supply voltage $V_{CC}=5\pm0.5$ V in ordinary operation and $V_{CC}=8$ V in aging and when the internal supply voltage $V_I=3$ V in ordinary operation and $V_I=4$ V in aging. $V_1$ is a stabilized voltage like the one in the case of FIG. 1. On the other side, $V_2$ rises monotonously in accordance with $V_{CC}$ ($V_2=V_{CC}/2$ herein). Accordingly, $V_1>V_2$ when $V_{CC}<6$ V, and $V_1<V_2$ when $V_{CC}>6$ V. Since $V_I$ equals the higher of $V_1$ and $V_2$, $V_I=3$ V when $V_{CC}<6$ V, while $V_I=V_{CC}/2$ when $V_{CC}>6$ V. In other words, the characteristics bent at a point whereat $V_{CC}$ is some voltage (6 V in this case) between an ordinary operation voltage and an aging voltage, are obtained. When $V_{CC}$ is within the sphere of the ordinary operation voltage ($5\pm0.5$ V herein, denoted by $\underline{a}$ in the figure), $V_I$ is stabilized, and therefore the operation of the internal circuit becomes stable. When $V_{CC}$ is within the aging voltage (8 V herein, denoted by $\underline{b}$ in the figure), $V_I$ becomes higher (4 V herein) than in ordinary operation. Therefore a higher voltage than in ordinary operation is impressed on the internal voltage, so that the voltage aging of the internal circuit be conducted.

As is apparent from the above description, the voltage generator 1 for ordinary operation needs to meet only the characteristics shown when $V_{CC}$ is within the sphere of the ordinary operation voltage, while the voltage generator 2 for aging needs to meet only the characteristics shown when $V_{CC}$ is within the aging voltage. In other words, the generators 1 and 2 can be designed independent of each other. The problem in the previously-described prior art that the characteristics in ordinary operation affect those in aging is thus removed. Therefore, a circuit design is easier than according to the prior art.

Figure 3A:
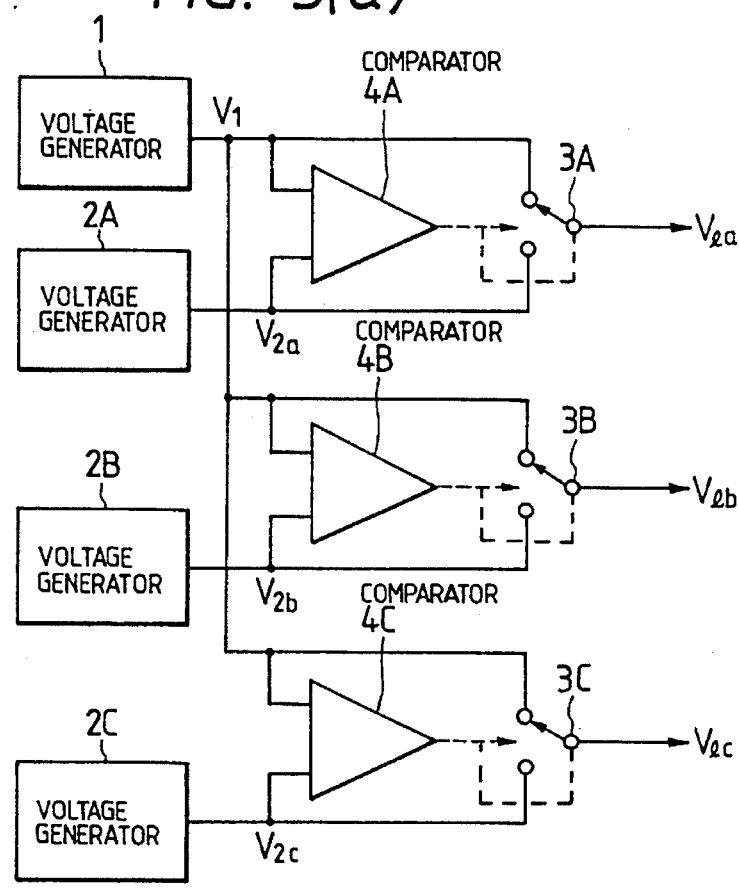

FIG. 3(a) is a structural view of a voltage converter which is a third embodiment of the present invention. This circuit differs from the circuit of FIG. 2 in that a plurality of output terminals ($V_{Ia}$, $V_{Ib}$, $V_{Ic}$) are provided. Moreover, the voltage generator for aging, the selector and the comparator are provided in a plurality respectively. Voltage generators 2A, 2B and 2C for aging generate voltages $V_{2a}$, $V_{2b}$ and $V_{2c}$ respectively. Selectors 3A, 3B and 3C generate $V_{Ia}$, $V_{Ib}$ and $V_{Ic}$ respectively from the voltage $V_1$ for ordinary operation and the voltages $V_{2a}$, $V_{2b}$ and $V_{2c}$ for aging. On the occasion, the voltage for ordinary operation is compared with the voltages for aging by comparators 4A, 4B and 4C respectively, and the higher voltages are selected to be $V_{Ia}$, $V_{Ib}$ and $V_{Ic}$ in the same way as in the case of FIG. 2.

Figure 3B:
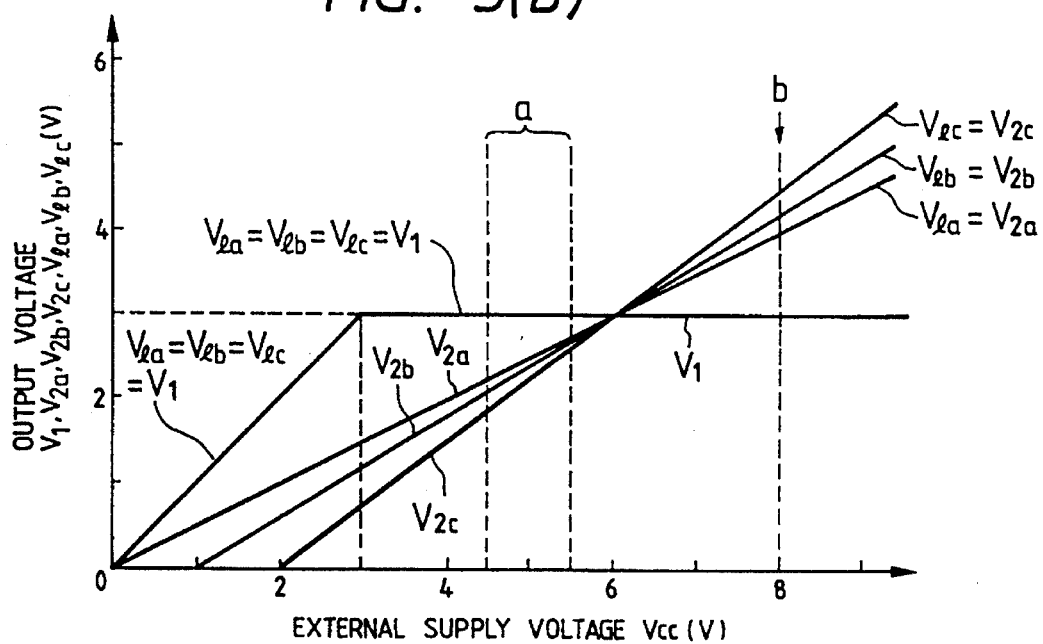

The characteristic feature of this circuit lies in that the voltage aging can be executed in different conditions according to circuits. One example of the $V_{CC}$ dependency of an output voltage is shown in FIG. 3(b). When $V_{CC}$ is within the sphere of the ordinary operation voltage (denoted by $\underline{a}$ in the figure), $V_1$ is higher than $V_{2a}$, $V_{2b}$ and $V_{2c}$, and therefore any one of $V_{I}a$, $V_{I}b$ and $V_{I}c$ is equal to $V_1$. When $V_{CC}$ is within the aging voltage (denoted by $\underline{b}$ in the figure), $V_{2a}$, $V_{2b}$ and $V_{2c}$ are higher than $V1$, and therefore $V_{I}a$, $V_{Ib}$ and $V_{Ic}$ are equal to $V_{2a}$, $V_{2b}$ and $V_{2c}$ respectively. In other words, $V_{I}a$, $V_{Ib}$ and $V_{Ic}$ are stabilized to be the same voltage in ordinary operation, while they turn to be different voltages from one another in aging. Accordingly, internal circuits whereon $V_{Ia}$, $V_{Ib}$ and $V_{Ic}$ are impressed respectively are subjected to aging in different conditions from one another.

Figure 15A:
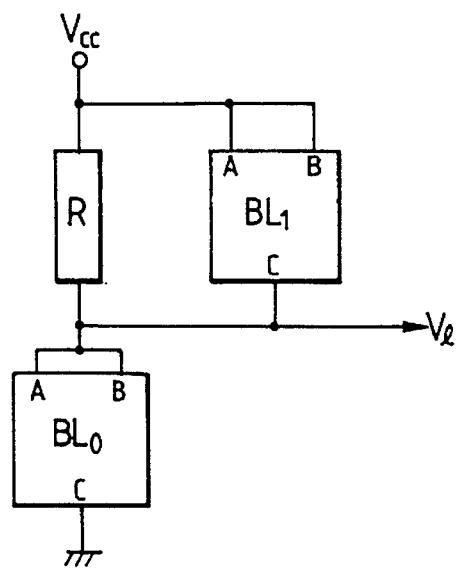
FIG. 15 is a circuit diagram of a prior-art voltage converter and a graph showing the characteristics thereof.
Figure 15B:
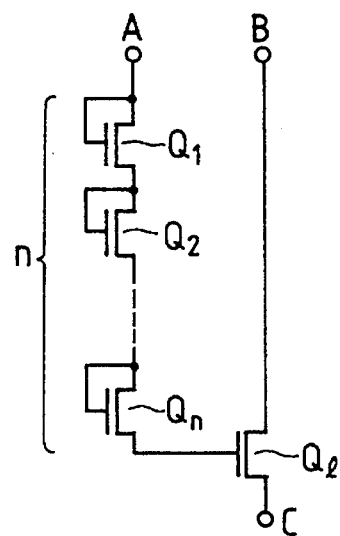
Figure 15C:
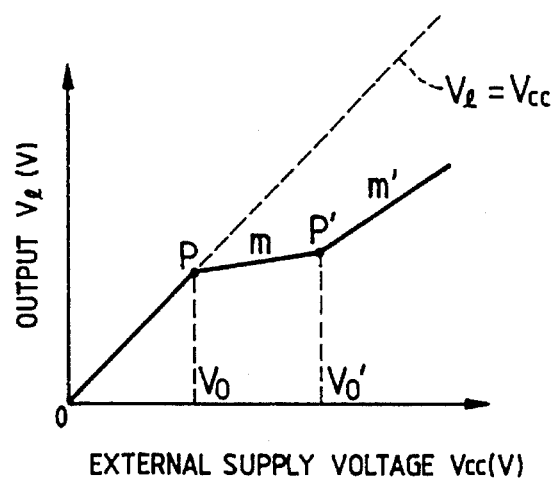

As described above, another characteristic feature of the present invention lies in that it enables the preparation of the circuit which makes it possible to execute aging in different conditions for each circuit. If it is intended to prepare the same circuit by the previously-described prior art, it would be needed to prepare a plurality of circuits of FIG. 15(a), for instance. If there is non-uniformity in elements among these circuits in a plurality, however, it would be difficult to make uniform voltage values in ordinary operation and the $V_{CC}$ dependency thereof. In the circuit of FIG. 3(a), in contrast, a plurality of internal supplies are prepared on the basis of one stabilized voltage $V_1$ in ordinary operation, and therefore it is easy to make their voltage values uniform.

Next, a detailed description will be made on individual circuits constituting the voltage converters in FIGS. 1 to 3 respectively.

Figure 4A:
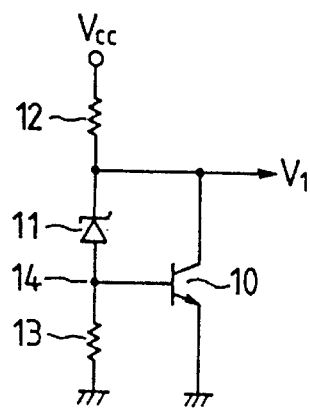
FIGS. 4 to 9 are circuit diagrams of element circuits in the voltage converters of FIGS. 1 to 3.
Figure 4B:
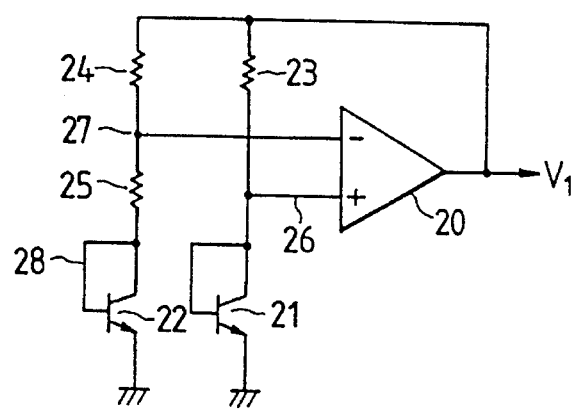

First, the voltage generator 1 for ordinary operation will be described. A well-known stabilized-voltage generator, e.g. a circuit using a breakdown voltage of a Zener diode or a base-emitter voltage of a bipolar transistor as a reference voltage, can be employed as the voltage generator 1 for ordinary operation. One example of such a circuit is shown in FIG. 4(a). In the figure, numeral 10 denotes an NPN transistor, 11 a Zener diode, 12 and 13 resistors. A voltage between an output $V_1$ and a node 14 and a voltage between the node 14 and the earth are a breakdown voltage $V_2$ of 11 and a base-emitter voltage $V_{be}$ of 10 respectively, and either of them is fixed substantially irrelevant to the supply voltage $V_{CC}$. Accordingly, an output voltage of this circuit is $V_1=V_2+V_{be}$, i.e. fixed. If such a band-gap reference as shown in FIG. 4(b) is used, a voltage being stable for a change in temperature as well as for a change in $V_{CC}$ can be obtained. Besides, a circuit proposed in Japanese Patent Application No. 123797/1987, for instance, may be employed as well.

Figure 5A:
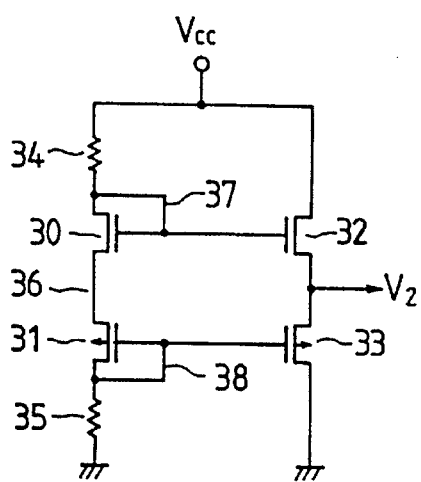

Next, the voltage generator 2 will be described. The output $V_2$ of the voltage generator 2 is used in testing or aging of a semiconductor device, and therefore the characteristics thereof are to be determined in accordance with the conditions of testing or those of aging. The voltage generator 2 for aging employed in the embodiment of FIG. 2, for instance, is a circuit which generates a voltage of ½ of the supply voltage $V_{CC}$. This can be realized by a circuit as shown in FIG. 5(a), for instance. In the figure, numerals 30 and 32 denote n-channel MOS transistors, 31 and 33 p-channel MOS transistors, and 34 and 35 resistors. On-resistance of the MOS transistors is smaller sufficiently than $R_{34}$ and $R_{35}$ ($R_{34}$ and $R_{35}$ are resistance values of 34 and 35 respectively), and if $R_{34}=R_{35}$, a voltage of a node 36 is ½ of the supply voltage $V_{CC}$, i.e. $V_{CC}/2$. Accordingly, voltages of nodes 37 and 38 are $V_{CC}/2+V_{tn}$ and $V_{CC}/2-|V_{tp}|$ respectively ($V_{tn}$ and $V_{tp}$ are threshold voltages of the n-channel MOS transistor and the p-channel MOS transistor respectively), and the output voltage is $V_2=V_{CC}/2$. By changing the ratio between $R_{34}$ and $R_{35}$, besides, it is made possible to generate a voltage being multiple of $V_{CC}$ (e.g. $0.6\ V_{CC}$ as in the voltage generator for testing of FIG. 1).

Figure 5B:
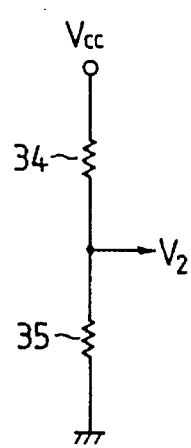
Figure 8:
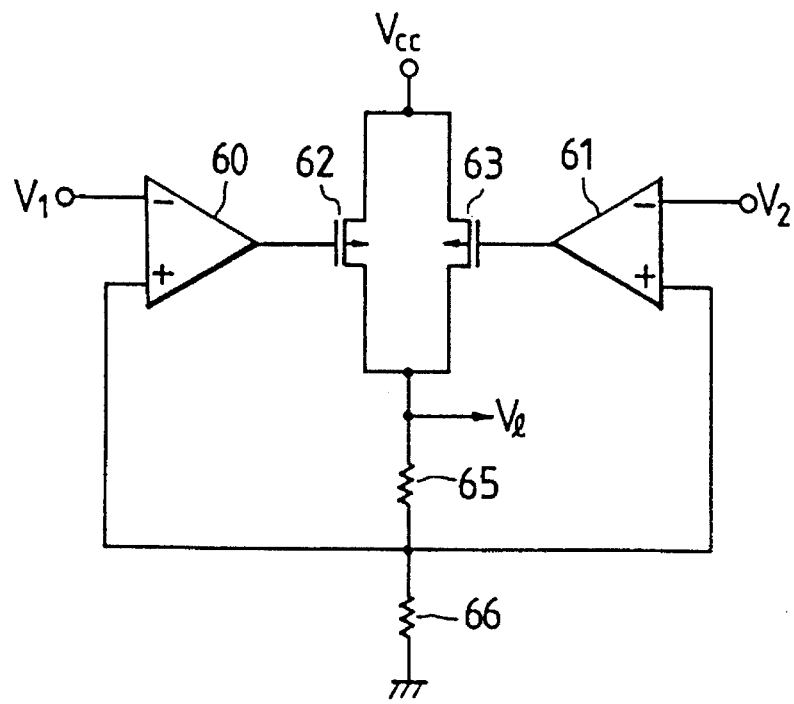

The characteristic features of this circuit lie in that a consumed current is determined by $R_{34}$ and $R_{35}$ and that current drivability is determined by the MOS transistors 32 and 33 in an output stage. By setting $R_{34}$, $R_{35}$ and the channel widths of 32, 33 large enough, accordingly, a circuit consuming small current and having large current drivability can be prepared. In the case when the current drivability does not need to be large (e.g. when a circuit of FIG. 8 is employed as the selector 3 and the comparator 4 as will be described later), a circuit of FIG. 5(b) or (c) may be employed. The circuit of FIG. 5(b) is formed simply by dividing $V_{CC}$ by resistors $R_{34}$ and $R_{35}$. A modified version of FIG. 5(b), could be formed using a plurality of diode-connected MOS transistors 36 to 38 are used instead of resistors. This circuit is advantageous in that it occupies a smaller area than that formed by using the resistors. In the case when the division ratio is a simple integral ratio (2:1 in the example of the figure), in particular, all the MOS transistors are formed in the same shape to avoid a back-bias effect, and thereby a circuit that is hardly affected by the non-uniformity in manufacture can be prepared. In the example of the figure, a p-channel MOS transistor in an n-well is used and each n-well is connected to the source of each MOS transistor which is diode-connected, so as to avoid the back-bias effect.

Figure 5C:
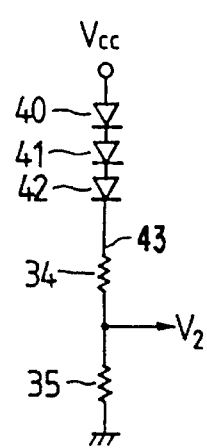

Another method for realizing the voltage generator 2 is shown in FIG. 5(c). This circuit generates a voltage obtained by application of an offset voltage being multiple of the external supply voltage $V_{CC}$ ($V_2=3\ V_{CC}/4-1.5(V)$ herein). In the figure, numerals 40 to 42 denote diodes, and the three diodes are connected in series so that a voltage of a node 43 be lower by about 2 V than the supply voltage $V_{CC}$. When the resistance ratio is set to be $R_{34}:R_{35}=1:3$, an output voltage of $V_2=3/4\ (V_{CC}-2)=3\ V_{CC}/4-1.5(V)$ can be obtained.

Figure 6:
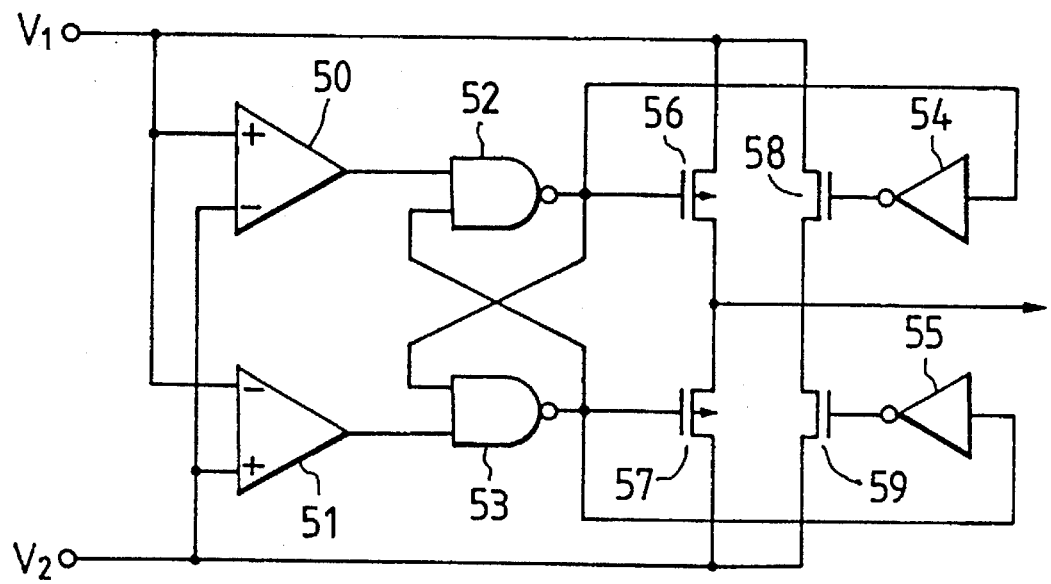

Next, a description will be made on a method for realizing the selector 3 and the comparator 4 employed for the embodiments of FIGS. 2 and 3. One method for realizing the selector 3 and the comparator 4 is shown in FIG. 6. In the figure, numerals 50 and 51 denote differential amplifiers, 52 and 53 NAND gates, 54 and 55 inverters, 56 and 57 p-channel MOS transistors, and 58 and 59 n-channel MOS transistors. In this circuit, the higher in voltage of inputs $V_1$ and $V_2$ is connected to an output $V_I$ through MOS transistors 56, 58 or 57, 59. When $V_1$ is higher than $V_2$, outputs of the differential amplifiers 50 and 51 turn to be of high potential and low potential respectively, while outputs of the NAND gates 52 and 53 turn to be of low potential and high potential respectively. Therefore the p-channel MOS transistor 56 becomes continuous, while 57 becomes non-continuous. Moreover, outputs of the inverters 54 and 55 turn to be of high potential and low potential respectively, and therefore the n-channel MOS transistor 58 becomes continuous and 59 non-continuous. Accordingly, the input $V_1$ and the output $V_I$ are connected through the MOS transistors 56 and 58. When $V_2$ is higher than $V_1$, to the contrary, the amplitude of the potential is reverse to the above, and the input $V_2$ and the output $V_I$ are connected through the MOS transistors 57 and 59.

The characteristic feature of the present circuit lies in that the input $V_1$ gurns to be the output $V_I$ as it is when $V_1>V_2$. By designing the circuit so that the ON-resistance of MOS transistors 56 and 58 be small enough, accordingly, the voltage stability of the output $V_I$ can be made to have the same value as that of the output $V_1$ of the voltage generator 1 for ordinary operation.

Figure 7:
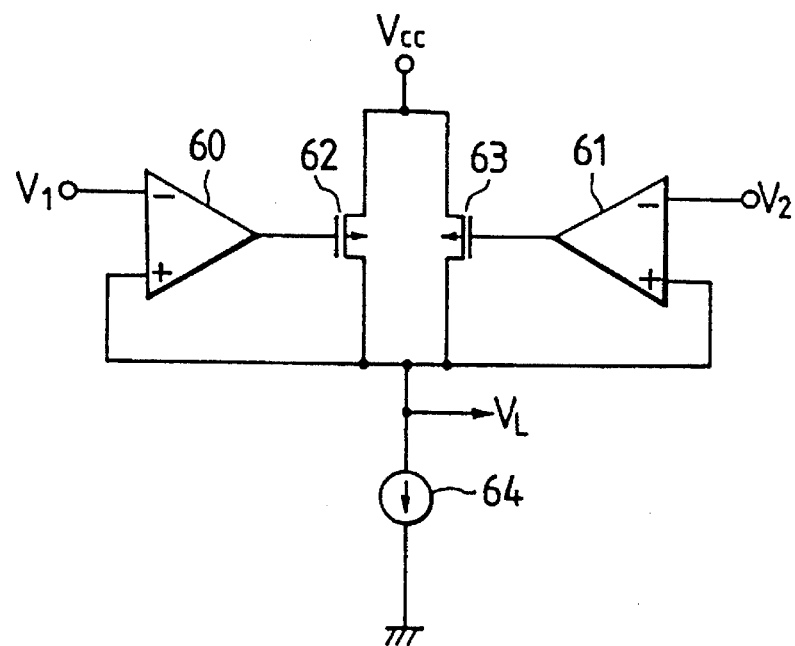

Another method for realizing the selector 3 and the comparator 4 is shown in FIG. 7. In the figure, numerals 60 and 61 denote differential amplifiers, 62 and 63 p-channel MOS transistors, and 64 a current source. The present circuit is composed of a voltage amplifier formed of 60 and 62 and of a voltage amplifier formed of 61 and 63, and the transistors 62 and 63 in the respective output stages of the two amplifiers are connected in parallel. The current source 64 is provided to give a bias current to the output stages. When $V_1>V_I$, an output of the differential amplifier 60 turns to be of low potential, and therefore the p-channel MOS transistor 62 is put in the state of continuity. When $V_1<V_I$, on the other hand, the output of the differential amplifier 60 turns to be of high potential, and therefore 62 becomes non-continuous. At the same time, the MOS transistor 63 is continuous when $V_2<V_I$, and non-continuous when $V_2<V_I$. When the output voltage $V_I$ is lower than one of $V_1$ and $V_2$ at least, accordingly, at least one of MOS transistors 62 and 63 is in the state of continuity, and therefore a current flows from the supply $V_{CC}$ to $V_I$, so as to make the potential of $V_I$ rise. This rise of potential continues until both of the MOS transistors 43 and 44 turn to be in the state of non-continuity with $V_I$ becoming equal to the potential of the higher of $V_1$ and $V_2$. After all, $V_I$ turns stable in a state wherein it is equal to the potential of the higher of $V_1$ and $V_2$.

The present circuit is characterized in that the circuit itself has a function of amplification. Even when the current drivability of the voltage generators 1, 2, 2A, 2B and 2C of FIGS. 2 and 3 is small, therefore, the current drivability of $V_I$ can be made large. Accordingly, not the circuit of FIG. 5(a), but the simple circuit of FIG. 5(b) or (c) can be employed, for instance, as the voltage generator 2.

While the output voltage $V_I$ is equal to the input voltage $V_1$ or $V_2$ in the above example, it can also be made multiple of $V_1$ or $V_2$. FIG. 8 shows one method for realizing a circuit making this available. This circuit differs from the circuit of FIG. 7 in that the differential amplifiers 60 and 61 do not receive $V_I$ itself as an input, but receive a voltage $R_{66}V_I/(R_{65}+R_{66})$ which is obtained by dividing $V_I$ by resistances 65 and 66 ($R_{65}$ and $R_{66}$ are resistance values of 65 and 66 respectively). Therefore the voltage $R_{66}V_I/(R_{65}+R_{66})$ is equal to the higher of the voltages $V_1$ and $V_2$. In other words, the output voltage $V_I$ is $(R_{65}+R_{66})/R_{66}$ times as high as the higher of the voltages $V_1$ and $V_2$.

This circuit is advantageous in that a voltage being arbitrary multiple of an input voltage can be obtained by changing the ratio between the resistances $R_{65}$ and $R_{66}$. This advantage is effective particularly for the case when only a specified voltage is obtained as the stabilized voltage $V_1$. In the case when the previously-mentioned band-gap reference is used as the voltage generator 1, for instance, the output voltage thereof is $V_1=1.26$ V. In order to obtain therefrom the output voltage $V_I=3$ V, for instance, it is only required to set the ratio to be $R_{65}:R_{66}=1.74:1.26$.

Figure 9:
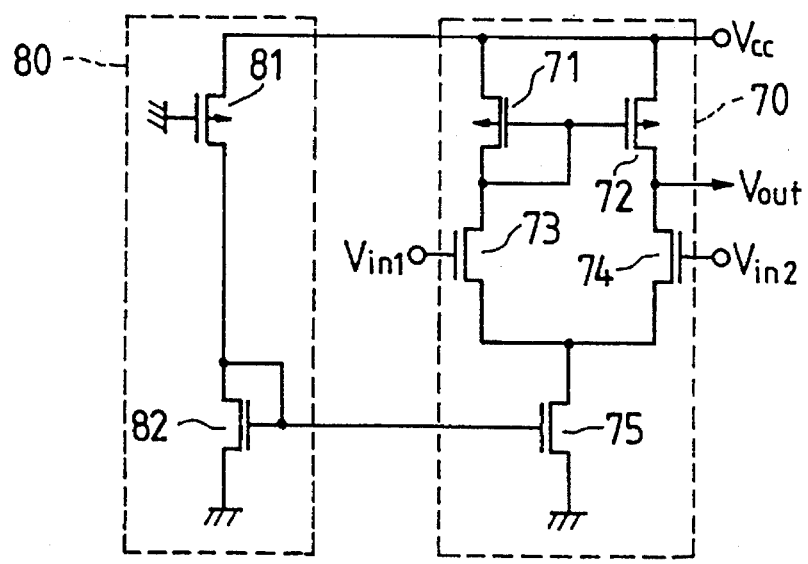

Besides, the differential amplifiers employed in the circuits of FIGS. 6 to 8 can be realized, for instance, by a circuit of FIG. 9. In the figure, numeral 70 denotes the main body of the differential amplifier, which consists of p-channel MOS transistors 71, 72 and n-channel MOS transistors 72, 73, 74. When the voltage of an input $V_{in1}$ is higher than that of $V_{in2}$, an output $V_{out}$ turns to be of high potential, and when the voltage of $V_{in2}$ is higher than that of $V_{in1}$, $V_{out}$ turns to be of low potential. Numeral 80 denotes a circuit for making the MOS transistor 74 operate as a current source. 81 denotes a p-channel MOS transistor operating as a high resistance, and it determines a current flowing to an n-channel MOS transistor 82. 74 and 82 form a current mirror circuit, and therefore a current being multiple of the current flowing to 82 (the ratio in conductance between 74 and 82) flows to 74. In the case when a plurality of differential amplifiers are employed as in FIGS. 6 to 8, the area occupied thereby can be saved by providing the circuit 80 only in one and by connecting commonly the gates of the transistors 74 of the differential amplifiers in a plurality.

Figure 10:
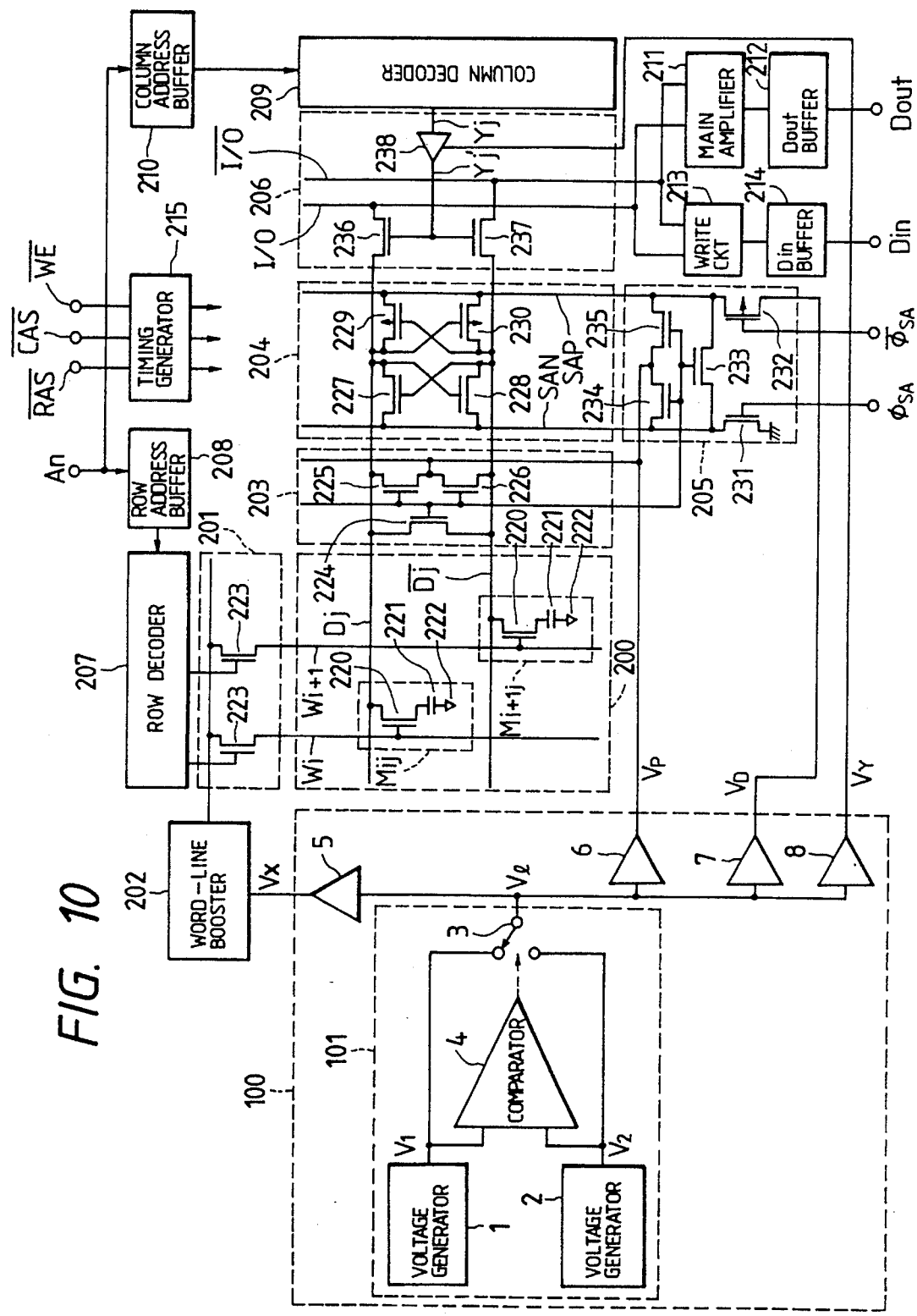
FIG. 10 is a structural view of DRAM to which the present invention is applied.
Figure 11:
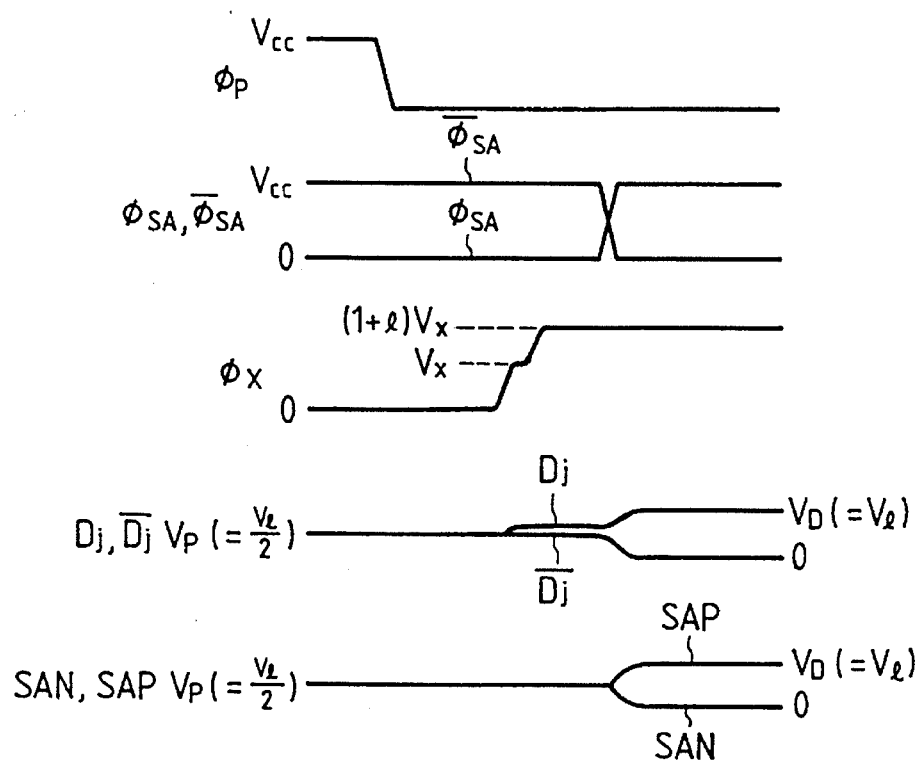
FIG. 11 is an operating waveform diagram of DRAM of FIG. 10.

Next, a description will be made on an example wherein the present invention is applied to DRAM (dynamic random access memory). FIG. 10 is a structural view of DRAM to which the present invention is applied, and FIG. 11 is an operation waveform diagram thereof. In the figure, numeral 100 denotes a voltage converter according to the present invention, 200 a memory array, 201 a word driver, 202 a word-line booster, 203 a data-line precharge circuit, 204 a sense amplifier, 205 a sense amplifier drive signal generator, 206 a data-line selector, 207 a row decoder, 208 a row address buffer, 209 a column decoder, 210 a column address buffer, 211 a main amplifier, 202 a $D_{out}$ buffer, 213 a write circuit, 214 a $D_{in}$ buffer, and 215 a timing generator. In this memory, small geometry MOS transistors are employed for the memory array 200 which has a large effect on integrity, and they are operated by an internal supply $V_l$ (e.g. 3.3 V) lower than an external supply $V_{CC}$ (e.g. 5 V). On the other side, the circuits 207 to 215 having not so large an effect on the integrity are operated directly by the external supply $V_{CC}$. In order to operate the memory array by $V_l$, internal supplies $V_x$, $V_p$, $V_d$ and $V_y$ are supplied from the voltage converter 100 to the word-line booster 202, the data-line precharge circuit 203, the sense amplifier drive signal generator 205 and the data-line selector 206, respectively.

Figure 12A:
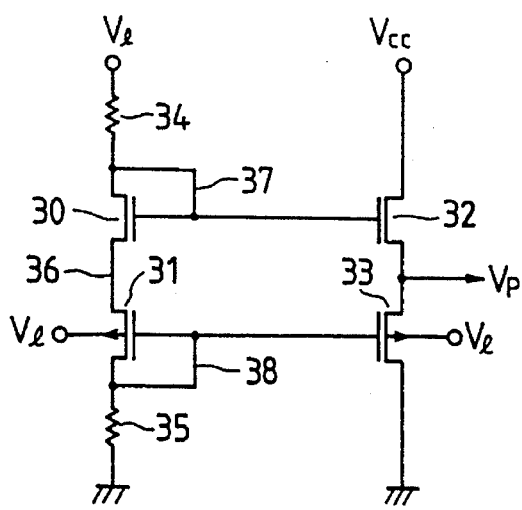
FIGS. 12 and 13 are circuit diagrams of element circuits of DRAM of FIG. 10.

In the voltage converter 100, a circuit 101 generating $V_l$ is constructed in the same way as in FIG. 2(a). Concretely, the higher of the voltages of the voltage generator 1 for ordinary operation and the voltage generator 2 for aging is selected to be $V_l$ by the selector 3. Buffers 5 to 8 are provided for making load drivability large. The buffers 5, 7 and 8 are circuits generating the voltages $V_x$, $V_d$ and $V_y$ equaling $V_l$ respectively. The buffer 6 is a circuit generating the voltage V which is ½ of $V_l$. As for the buffers 5, 7 and 8, a circuit proposed in Japanese Patent Application No. 294115/1987, for instance, can be used therefor. The buffer 6 can be realized, for instance, by a circuit of FIG. 12(a). This circuit generates a voltage of ½ of a supply voltage ($V_l$ herein), like the circuit of FIG. 5(a). In the present circuit, however, an MOS transistor 32 in an output stage alone is connected not to $V_l$ but to $V_{CC}$. This is because $V_{CC}$ having larger current drivability is preferable for the output stage which is required to drive a load directly, although the connection may be made to $V_l$, of course.

In the memory array 200, so-called 1-transistor 1-capacitor type dynamic memory cells $MC_{ij}$ each consisting of an MOS transistor 220 and a capacitor 221 are disposed at the intersecting points of word lines $W_i$ and data lines $D_j$. Although only two word lines ($W_i$, $W_{i+1}$) and only a pair of data lines ($D_j$, $\overline{D}_j$) are shown in the figure, these lines are disposed in large numbers, in practice, longitudinally and laterally. Besides, one end 222 (plate) of the capacitor 221 is connected to a direct-current source. Although the voltage value thereof may be set arbitrarily, it is preferable to connect the cells to $V_p$ (=$V_l$/2) in view of the breakdown voltage of the capacitor 221.

The word driver 201 is a circuit which receives an output of the row decoder 207 and supplies a word-line drive signal $\phi_x$ to a selected word line through an MOS transistor 223. The signal $\phi_x$ is prepared by the word-line booster 202. This circuit 202 boosts $\phi_x$ to be higher than a supply voltage. The power source of this circuit is not the external supply $V_{CC}$, but the internal supply $V_x$ prepared by the voltage converter. Accordingly, $\phi_x$ is boosted with $V_x$ as a reference, not with $V_{CC}$. In other words, the voltage of $\phi_x$ is (1+α) times (0<α<1) as high as $V_x$ as shown in FIG. 11.

Figure 13:
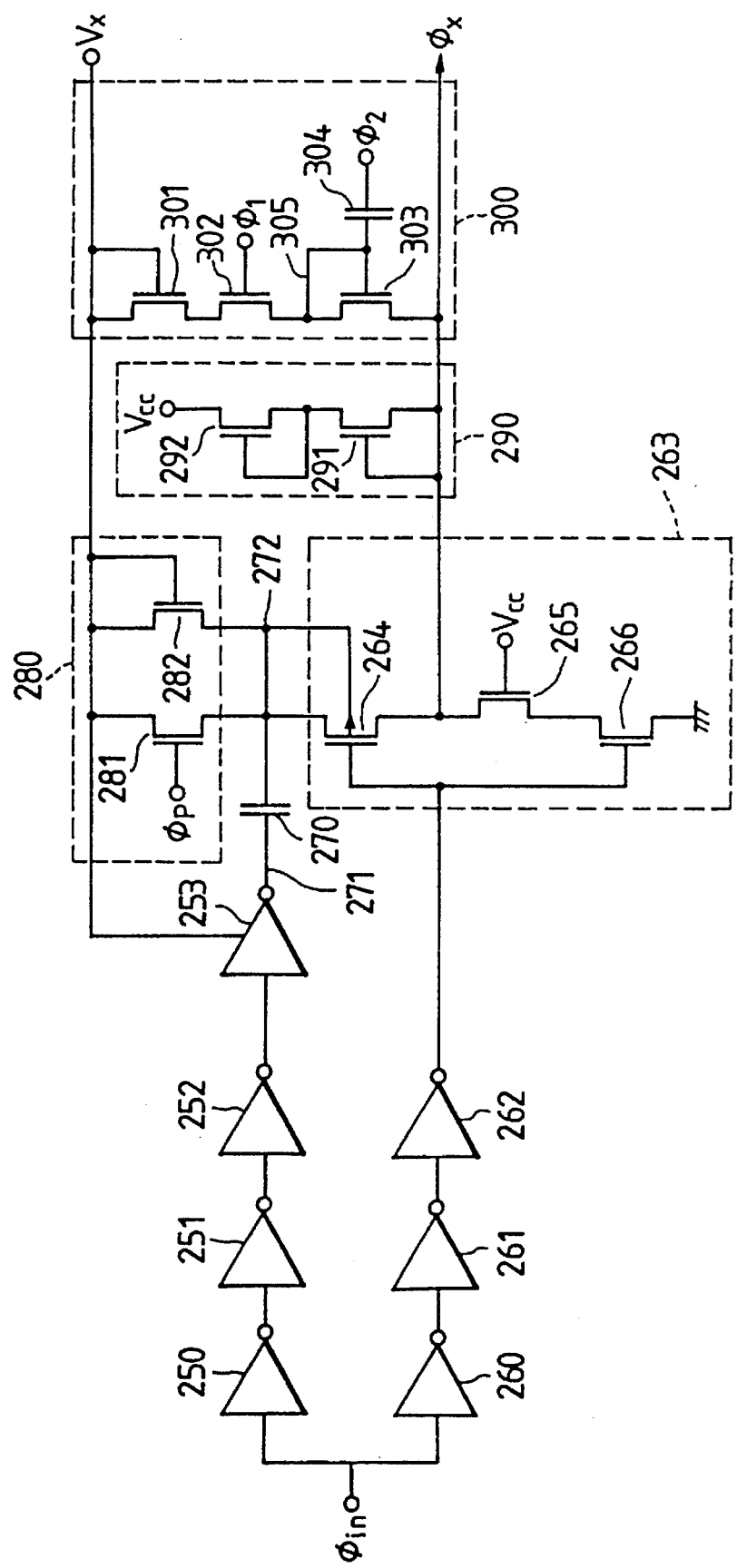

One method for realizing the word-line booster 202 is shown in FIG. 13. This is a circuit which generates the signal $\phi_x$ a prescribed time after an input signal $\phi_{in}$ turns to be of high potential. The main part of this circuit consists of inverters 250 to 253, 260 to 263, a capacitor 270 for boosting, and a precharge circuit 280. Trains of the inverters 250 to 252 and 260 to 262 form a circuit for obtaining a prescribed delay time. While $V_{CC}$ is used as a power source for these inverters, $V_x$ may also be used therefor. Outputs of 252 and 262 are varied from high potential to low respectively a prescribed time after $\phi_{in}$ turns to be of high potential. An output of 253 rises, consequently. Since the power source of this inverter 253 is $V_x$, the voltage of a node 271 is varied from 0 V to $V_x$. With the potential of one end 271 of the capacitor 270 rising, the potential of the other end 272 of the capacitor rises due to capacity coupling. The voltage of the node 272 is Set beforehand to be $V_x - V_t$ ($V_{tn}$ is the threshold voltage of an n-channel MOS transistor) by the precharge circuit 280 (a precharge signal $\phi_p$ is of high potential when the memory is in a standby state), and therefore it rises to $$V_x - V_t + \frac{C_b V_x}{C_b + C_p}$$

due to the capacity coupling. In the above expression, $C_b$ and $C_p$ denote the capacity of the capacitor 270 and the parasitic capacitance of the node 272 respectively. Since the inverter 263 (consisting of a p-channel MOS transistor 264 and n-channel MOS transistors 265 and 266) operates with this voltage as a supply, the potential of the output $\phi_x$ rises also to said voltage. MOS transistor 265 of the inverter 263 is provided so as to prevent the impression of an excessive voltage on 266. Since the gate of 265 is connected to $V_{CC}$ (it may also connected to $V_x$), the drain voltage of 266 does not exceed $V_{CC} - V_{tn}$. A circuit 290 is provided to prevent the excessive rise in the potential of $\phi_x$. The potential of $\phi_x$ does not exceed $V_{CC} + 2 V_{tn}$, since n-channel MOS transistors 291 and 292 in diode connection are connected in series, The source of this MOS transistor 292 may be connected also to $V_x$. A circuit 300 is provided for preventing the lowering of the potential of $\phi_x$ due to a leak current or the like when $\phi_x$ is boosted for a long period. Mark $\phi_1$ denotes a signal being of high potential while the memory is in an active state, and $\phi_2$ is a signal turning to be of high potential periodically. When $\phi_2$ turns to be of high potential, the potential of a node 305 is boosted to be higher than $V_x$ due to the capacity coupling by a capacitor 304, and the lowering of potential of $\phi_x$ is thereby complemented.

The data-line precharge circuit 203 is provided for setting each data line at a prescribed voltage (the internal supply voltage $V_p$ herein) prior to reading of memory cells. By the impression of a precharge signal $\phi_p$, MOS transistors 224 to 226 are put in the state of continuity, and the voltage of data lines $D_j$, $\overline{D}_j$ becomes equal to $V_p$. On the occasion, besides, sense amplifier drive signals SAN and SAP, on which a description will be made later, are set at $V_p$ simultaneously by MOS transistors 233 to 235.

When $\phi_x$ is impressed on the word line, a signal charge is read out of each memory cell to each data line, and the potential of the word line changes. The operation waveform diagram of FIG. 11 shows the case when a high potential ($\approx V_d$) is accumulated beforehand in the capacitor of the memory cell. The potential of the data line $D_j$ rises slightly, so as to cause a potential difference from $\overline{D}_j$. The sense amplifier 203 is a circuit for amplifying this minute signal, and it is constructed of a flip-flop of n-channel MOS transistors 227, 228 and a flip-flop of p-channel MOS transistors 229, 230. The sense amplifier is activated by turning $\phi_{sa}$ to be of high potential and $\overline{\phi}_{sa}$ to be of low potential and thereby putting MOS transistors in the state of continuity. SAN is earthed through 231, while SAP is connected to the internal supply $V_d$ through 232. In this way, the minute potential difference between the data lines $D_j$ and $\overline{D}_j$ is amplified, and one ($D_j$ in the case of FIG. 11) turns to be at $V_d$, while the other ($\overline{D}_j$ in the case of FIG. 11) turns to be at 0 V.

Figure 12B:
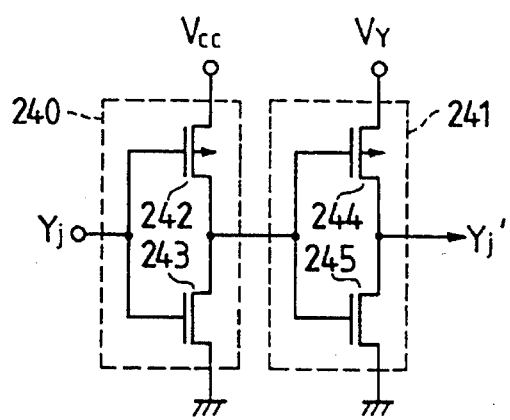

The data-line selector 206 is a circuit which receives an output of the column decoder 209 and connects a selected data-line couple to input/output lines I/O, $\overline{I/O}$ through MOS transistors 236,237. In the case of reading, data latched in the sense amplifier are outputted to a data output terminal $D_{out}$ through an input/output line, the main amplifier 11 and the $D_{out}$ buffer 212. In the case of writing, data inputted from a data input terminal $D_{in}$ are set on the input/output lines I/O, $\overline{I/O}$ through the $D_{in}$ buffer 214 and the write circuit 213 and further are written in the memory cells through the MOS transistors 236, 237 and the data lines $D_j$, $\overline{D}_j$. Numeral 238 denotes a circuit provided for limiting to $V_y$ the voltage of a signal $Y_j'$ to be impressed on the gates of the MOS transistors 236 and 237, and it can be realized, for instance, by connecting two stages (240, 241) of an inverter and using $V_y$ for the supply of the second stage, as shown in FIG. 12(b). In other words, the voltage amplitude of the signal $Y_j'$ is made to be $V_y$, while the voltage amplitude of an output $Y_j$ of the column decoder is $V_{CC}$. This circuit is provided by the following reason. The amplitude of the input/output line in writing is $V_{CC}$, since the write circuit 231 operates with $V_{CC}$. If the voltage of $Y_j'$ were not limited beforehand, accordingly, a voltage $V_{CC} - V_{tn}$ ($V_{tn}$ is the threshold voltage of MOS transistors 236, 237) would be applied on the memory array. By the way, the voltage of $Y_j'$ may be $V_{CC}$, if the write circuit 213 is made to operate with $V_l$. The circuit 238 is not needed in this case.

The row address buffer 208 and the column address buffer 210 are circuits which receive an address signal $A_n$ inputted from outside and generate a row address signal $a_{rn}$ and a column address signal $a_{cn}$ respectively. These address signals are used for selection of word lines and data lines by the row decoder 207 and the column decoder 209. The timing generator 215 is a circuit which generates internal timing signals necessary for the operation of the memory from control signals (a row address strobe signal RAS, a column address strobe signal CAS and a write enable signal WE) inputted from outside. As described previously, these circuits are operated directly by the external supply $V_{CC}$. This is because these circuits do not affect the integrity very much and therefore do not need the employment of small geometry MOS transistors therefor and because the use of the external supply is advantageous for an interface receiving external signals. However, they may also be designed to operate with $V_l$, of course.

Figure 14A:
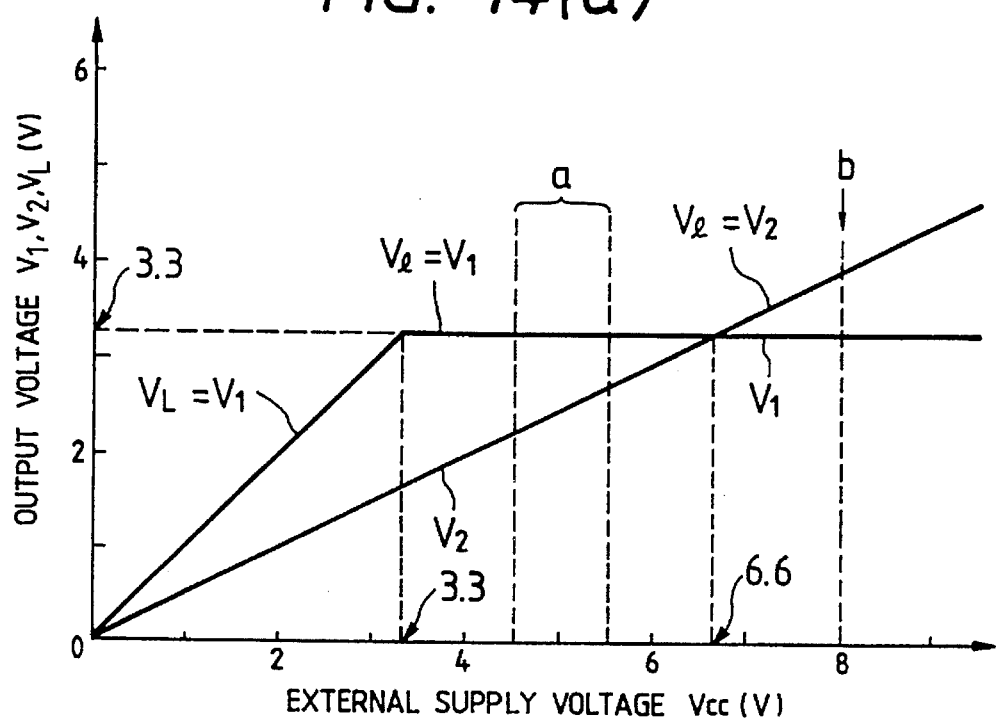
FIG. 14 is a graph showing the characteristics of the voltage converter in FIG. 10.
Figure 14B:
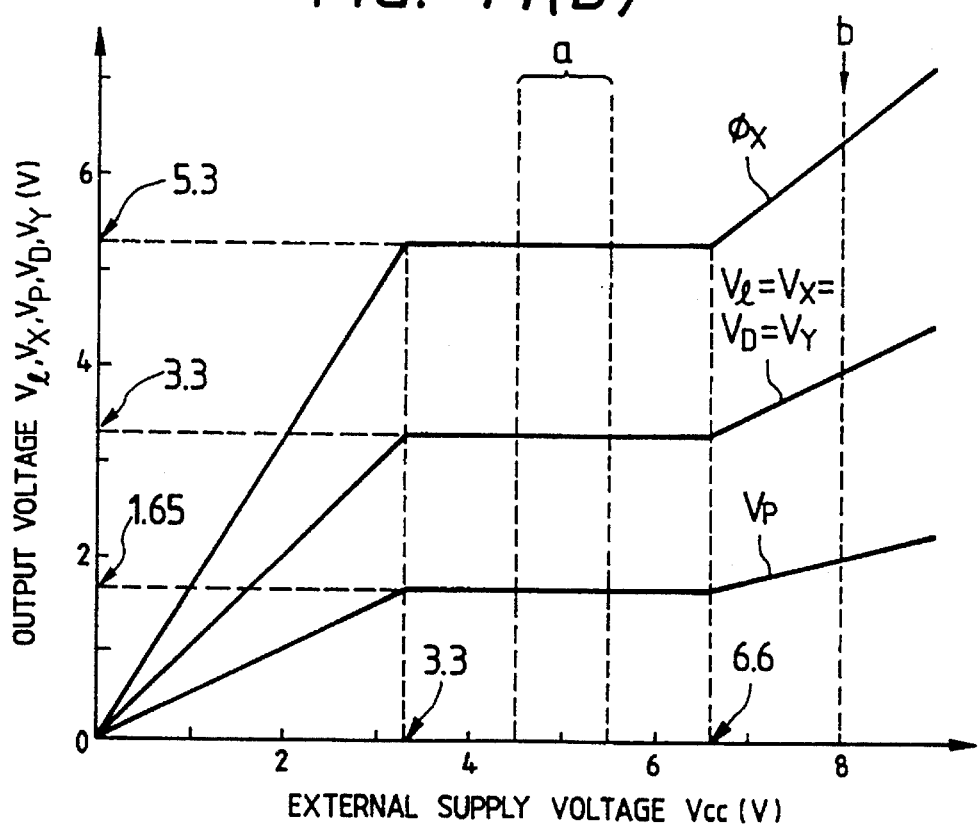

The $V_{CC}$ dependency of the voltage of each part is shown in FIG. 14(a) and (b). The figure exemplifies the case when an external supply voltage in ordinary operation is $V_{CC}=$ 5±0.5 V, one in aging is $V_{CC}=$8 V, an internal supply voltage in ordinary operation is $V_l$,3.3 V, and one in aging is $V_l=$4 V. When $V_{CC}$ is some voltage (6.6 V in this case) between an ordinary operation voltage and an aging voltage, the characteristics bent at said voltage are obtained in the same way as in the case of FIG. 2. Since $V_x$, $V_d$ and $V_y$ are equal to $V_l$, they are 3.3 V in ordinary operation and 4 V in aging. The voltage of the word-line drive signal $\phi_x$ is equal to $(1+\alpha) V_x$ as stated previously. The figure exemplifies the case of =0.6. In this case, the voltage is 5.3 V in ordinary operation and 6.4 V in aging.

According to the present invention, as described above, the characteristics in ordinary operation of an internal supply and the characteristics thereof in testing or aging can be designed independent of each other, and a voltage converter enabling the testing or aging of a semiconductor device can be prepared.

Figure 17:
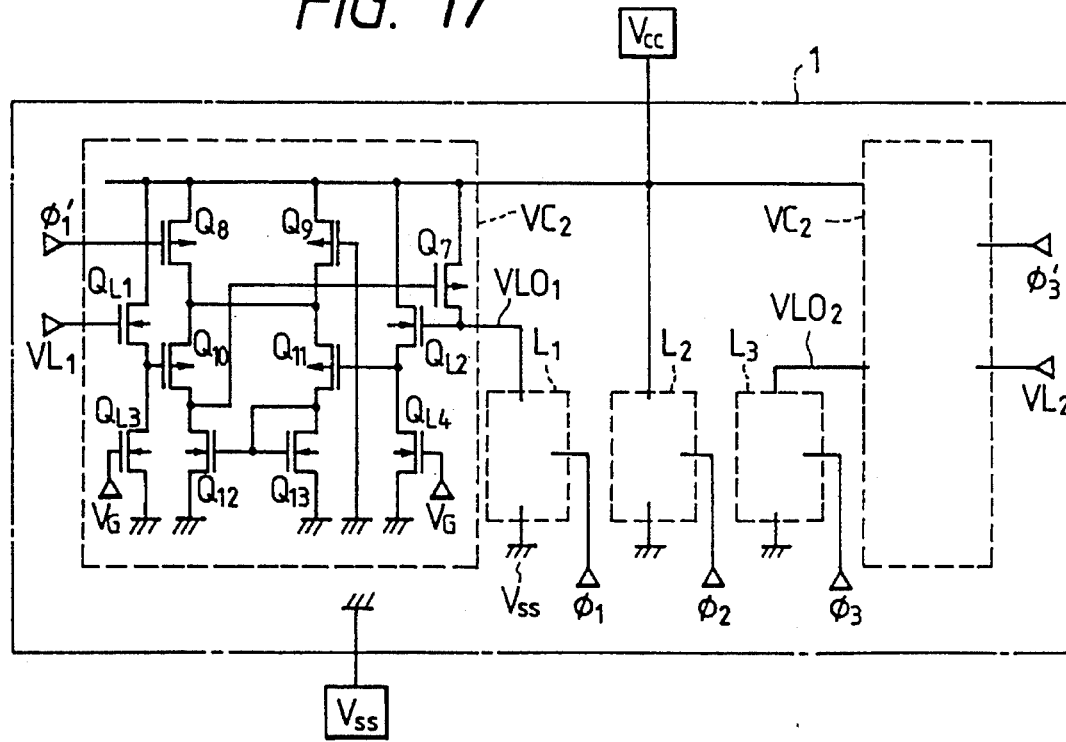

FIG. 17 shows a fourth embodiment of the present invention. This embodiment is characterized in that level shift circuits composed of $Q_{L1}$, $Q_{L3}$ and $Q_{L2}$, $Q_{L4}$ are inserted into the input terminal of the differential amplifier of the prior-art limiter shown in FIG. 26.

In this embodiment, a prescribed voltage $V_G$ is impressed on the gates of $Q_{L3}$ and $Q_{L4}$, and they operate as constant current sources. Accordingly, a fixed current flows to $Q_{L1}$ and $Q_{L2}$ irrespective of the gate voltage thereof. When the gate voltage of $Q_{L1}$, $Q_{L2}$ is denoted by $V_i$, the source voltage thereof by $V_o$, the drain current by $I_D$ and the drain conductance by $\beta$, an equation of $$I_D = \frac{\beta}{2}(V_i - V_o - V_T)^2$$

is established, and therefore the relationship between the output voltage and the input voltage is expressed by $$V_o = V_i - V_T - \sqrt{\frac{2I_D}{\beta}} \ .$$

Since $V_T$ and $I_D$ are unvaried, $V_o$ is lower by $$V_T + \sqrt{\frac{2I_D}{\beta}} \text{ than } V_i.$$

$V_o=$ 1.6(V) when $V_i=$3(V), $V_T=$1(V), $I_D=$1(μA) and =$10^{-5}$ (μS/V), and therefore the operational range of the differential amplifier is determined to be $V_{CC} \leq V_o + V_T =$2.6(V), as described previously.

According to the present embodiment, therefore, a voltage limiter circuit being operable sufficiently even with $V_{CC}=$ 3(V) can be realized.

In this method, signals are delayed by the provision of the level shift circuits. In order to make the device operate at higher speed, therefore, these circuits need to be deleted.

Figure 16:
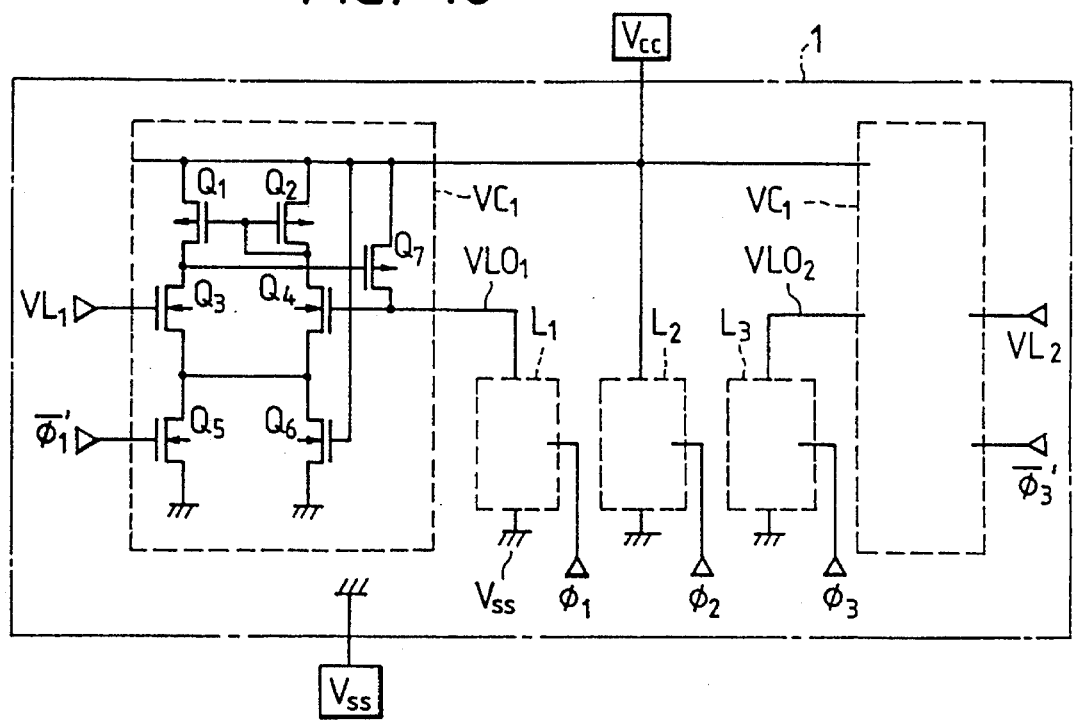
FIGS. 16 to 18 and FIGS. 20 to 24 are illustrations of embodiments of the present invention.
Figure 26:
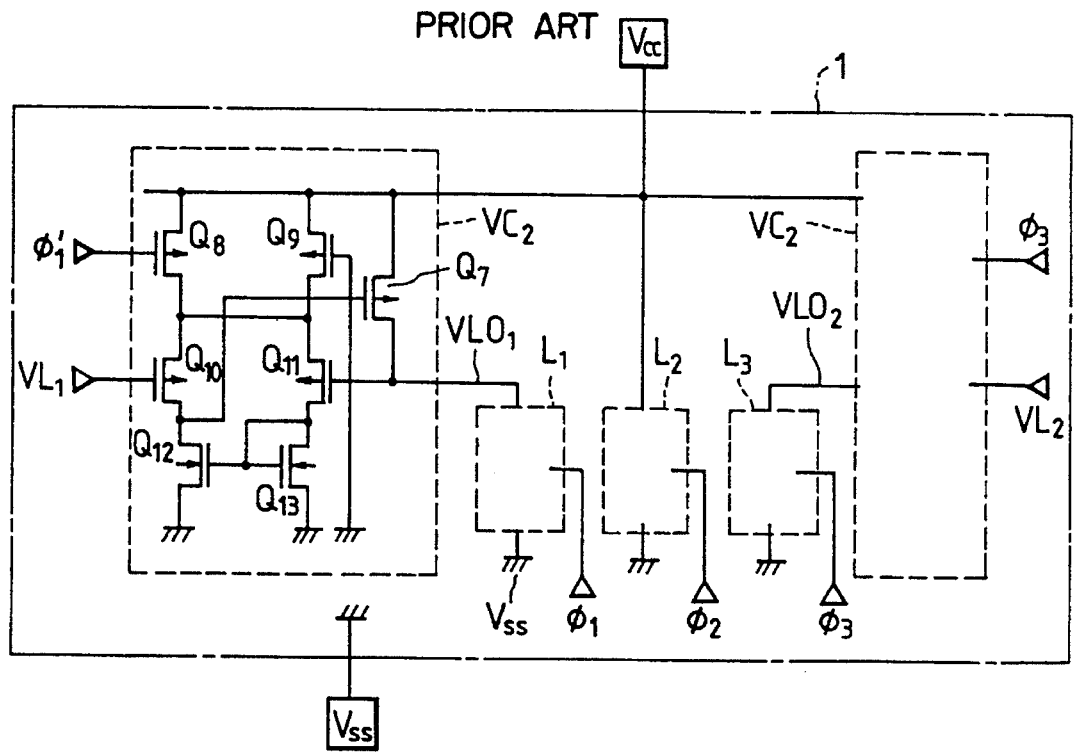
FIG. 26 is an illustration of a prior-art example.

FIG. 16 shows an embodiment (fifth embodiment) which solves the above-stated problem. This embodiment is characterized in that the differential amplifier of the prior-art limiter shown in FIG. 26 is replaced by the previously-described amplifier having P-channel transistors as a load. Herein a reference voltage VL (VL$_1$ in the figure) is inputted to the gate of an N-channel source-coupled pair transistor $Q_3$. On the other side, a limiter output VLO (VLO$_1$ in the figure) is inputted to the gate of the other source-coupled pair transistor $Q_4$. Since a comparison voltage is inputted directly to the N-channel source-coupled pair in this way, the number of elements through which signals pass can be reduced, and thus a high-speed operation can be attached. Besides, the source-coupled pair is of N-channel, and therefore the gate-souce voltage thereof is determined on the basis of $V_{ss}$, and so a current is not dependent on $V_{CC}$. In regard to VL, the operation is enabled in a wide range from $V_T$ to $V_{CC}$ when the threshold voltage of the source-coupled pair is $V_T$.

By the way, a transistor $Q_5$ for current control of the amplifier turns to be of N-channel, and therefore the phase of a control signal $\overline{\phi}_1$, therefor turns to be reverse to $\phi_1'$ of FIG. 17.

Figure 18:
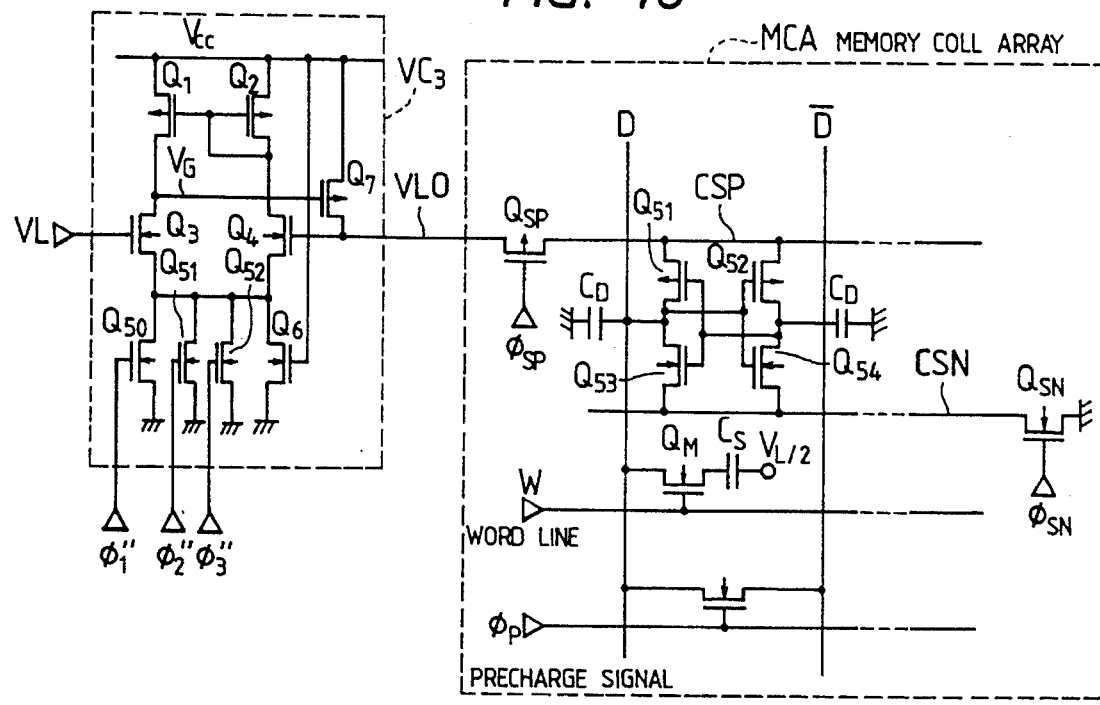

FIG. 18 shows a sixth embodiment of the present invention. This embodiment is characterized in that the current control transistor of the differential amplifier is divided into a plurality of units (three in the present embodiments) and each of them is driven by a signal being different in timing from one another.

The following is a description on the operation. In the figure, mark VC3 denotes a voltage limiter circuit, MCA a memory cell array to DRAM, DD a data line, W a word line, $Q_M$ and $C_S$ memory cells, $Q_{S1}$ to $Q_{S4}$ sense amplifiers, $Q_{SP}$ a transistor for driving the sense amplifier constituted by P-channel transistors $Q_{S1}$, $Q_{S2}$, and $Q_{SN}$ a transistor for driving the sense amplifier constituted by N-channel transistors $Q_{S3}$, $Q_{S4}$. Mark $\phi_p$ denotes a precharge signal.

Figure 19:
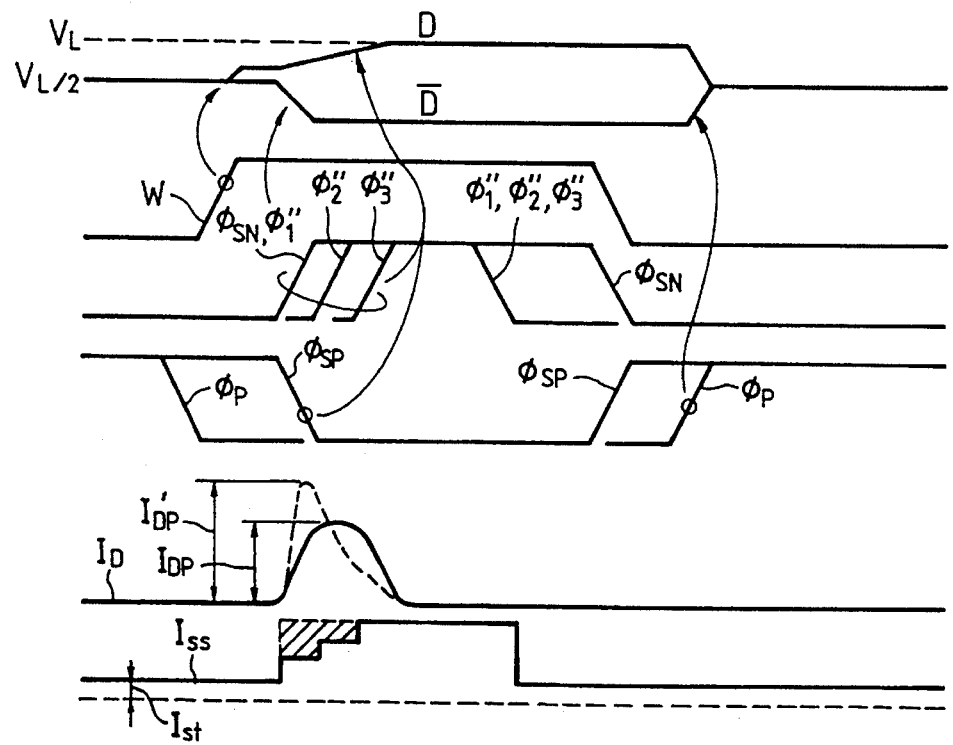
FIG. 19 is an operating waveform diagram of the embodiment of FIG. 18.

FIG. 19 shows operation timings of the circuit shown in FIG. 18. In the figure, data lines D, $\overline{D}$ are precharged at VL/2. When a word-line signal W rises herein, $Q_M$ turns ON, and a signal stored in $C_S$ appears on the data lines D, $\overline{D}$. When sense amplifier drive signals $\phi_{SP}$, $\phi_{SN}$ are charged subsequently, the sense amplifiers operate to amplify the foregoing signal. On the occasion, $Q_{S1}$, $Q_{S2}$ charge a data-line capacity $C_D$ on the High side up to VL, while $Q_{S3}$, $Q_{S4}$ discharge a data-line capacity $C_D$ on the Low side down to $V_{ss}$. A current waveform $I_D$ obtained when the data lines are charged has a shape of rising sharply and falling gradually as indicated by a broken line in FIG. 19, since the voltage limiter responds to load fluctuation at high speed when $\phi_1$, $\phi_2$, $\phi_3$ are made to rise simultaneously. Accordingly, the peak value of the current is large. This sharp fluctuation of the current makes a supply voltage fluctuate, which causes a false operation of the device. In the present embodiment, in contrast, $\phi_1$, $\phi_2$, $\phi_3$ are made to rise at an appropriate time interval after the sense amplifiers are driven, and consequently the response speed of the amplifiers is slow at first. Therefore the drivability of the voltage limiter becomes low, the peak just after charging is thereby reduced, and thus the waveform is shaped in a trapezoid as indicated by a solid line in the figure.

On the other side, the current consumed by the amplifiers themselves is also reduced by an amount indicated by a hatched part in the figure.

As described above, the present embodiment has an effect that the peak current is reduced in charging. In addition, it enables the reduction of a power consumed by the voltage limiter itself.

By applying the voltage limiter of the present embodiment to a circuit having a plurality of loads different in capacity, besides, an optimum consumed current can be selected in accordance with the capacity of each load, and thus power reduction can be attained.

Figure 20:
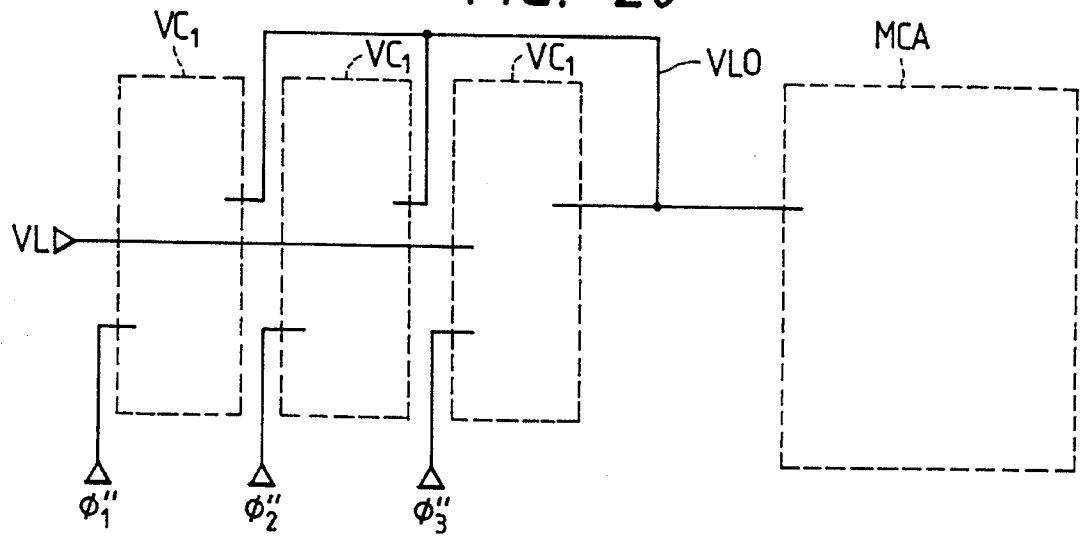

FIG. 20 shows a seventh embodiment of the present invention. This embodiment is characterized in that a plurality of voltage limiter circuits VC1 shown in FIG. 16 are connected in parallel and separate signals ($\phi_1$, $\phi_2$, $\phi_3$) are used as current control signals for the circuits respectively. This construction enables the attainment of the same effect as the fifth embodiment. Since the same circuits are connected in parallel, layout is needed only for one circuit, and thus the number of processes for design can be lessened.

Figure 21:
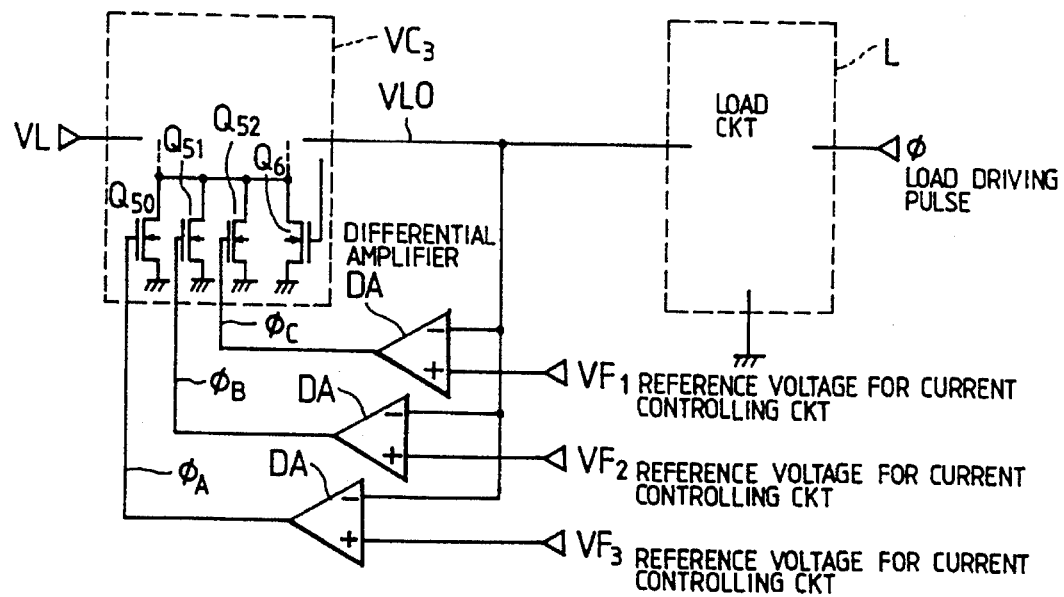

FIG. 21 shows a circuit which generates a current control signal for the differential amplifier. The present embodiment is characterized in that it enables the detection of the amount of fluctuation of an output voltage of the limiter and the automatic selection of a current value corresponding in amplitude thereto.

Figure 23:
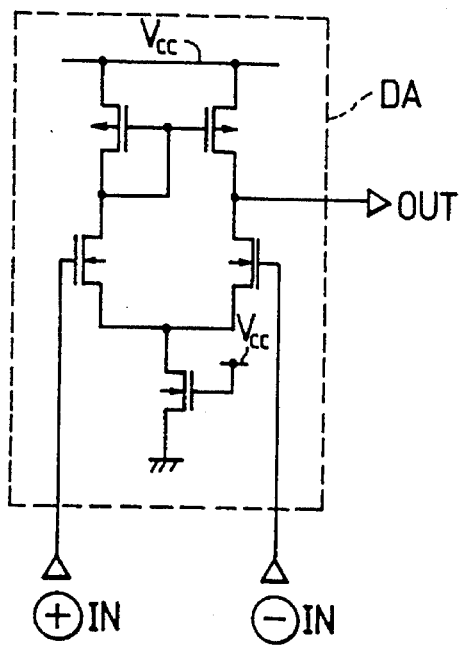

In the figure, mark DA denotes a differential amplifier as shown in FIG. 23, and $VF_1$, $VF_2$, $VF_3$ reference voltages being in the relationship of $VL>VF_1>VF_2>VF_3$. Besides, the channel widths $W_{50}$, $W_{51}$, $W_{52}$ of current controlling transistors $Q_{50}$, $Q_{51}$, $Q_{52}$ are in the relationships of $W_{50} \geq W_{51} \geq W_{52}$.

Figure 25:
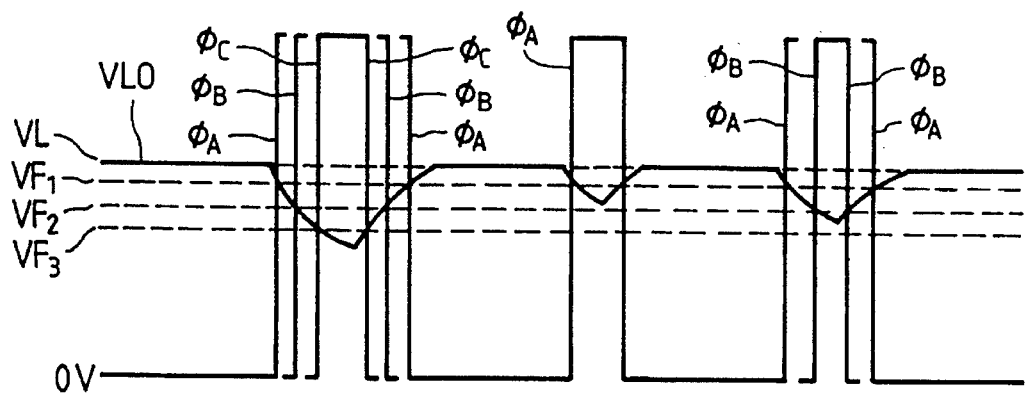
FIG. 25 is an operating waveform diagram of FIGS. 21 and 22.

The operation of this circuit will be described by using FIG. 25. When a drive signal $\phi$ is charged on a load L, a current flows through L and VL0 lowers. If VL0 lowers below $VF_3$, on the occasion, $VF_1$ and $VF_2$ turn to be higher than VL0 based on the above-stated relationship, therefore the plus input of all the three differential amplifiers becomes higher than the minus input thereof, and thus the state of all of $\phi_A$, $\phi_B$, $\phi_C$ changes from Low to High. Then all of $Q_{50}$, $Q_{51}$, $Q_{52}$ turn ON, the maximum current flows through a differential amplifier VC3, and thus the limiter turns to have the maximum drivability. If VL0 lowers to a voltage between $VF_1$ and $VF_2$, only $\phi_C$ turns High, and thereby $Q_{52}$ alone is turned ON. If VL0 lowers down to a voltage between $VF_2$ and $VF_3$, $\phi_B$ and $\phi_C$ turn High, and thereby $Q_{51}$ and $Q_{52}$ are turned ON.

As described above, the present embodiment enables the realization of an automatic operation wherein current controlling transistors in larger numbers are turned ON as VL0 lowers in a larger amount, while said transistors in smaller numbers are turned ON as VL0 lowers in a smaller amount, to the contrary. Accordingly, it is unnecessary to keep the current controlling transistors to be ON for a longer time than an actual charging time in view of the fluctuation in a supply voltage or the non-uniformity in processes as in the prior art, and thus a further power reduction can be attained. Moreover, it becomes unnecessary to extend wirings to the limiter for many current control signals, and therefore an area for layout can be reduced. Furthermore a circuit design is facilitated since it becomes unnecessary to know a change in a time required for a current flowing to a load.

Figure 22:
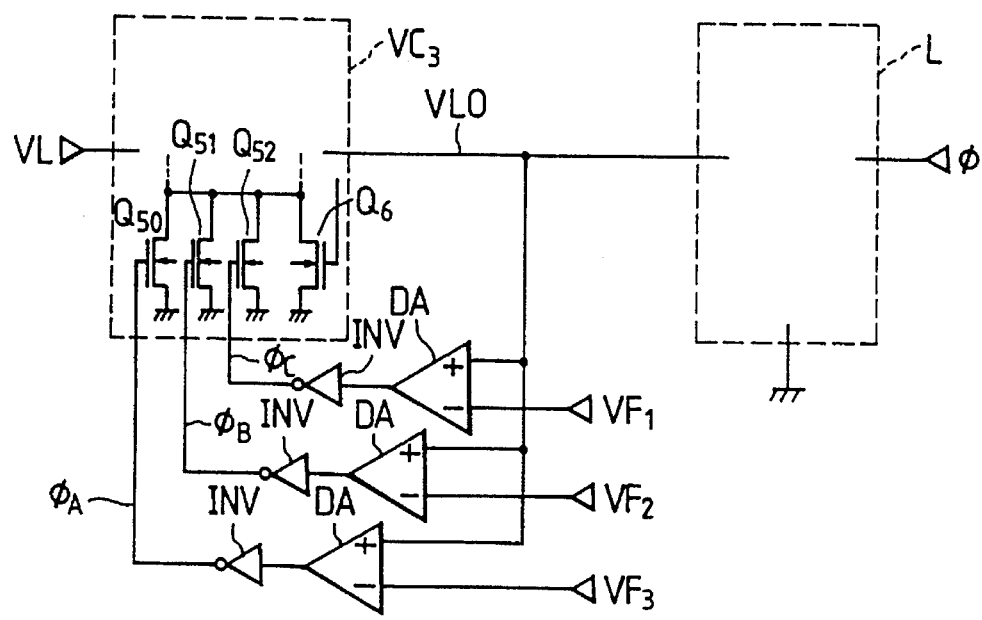
Figure 24:
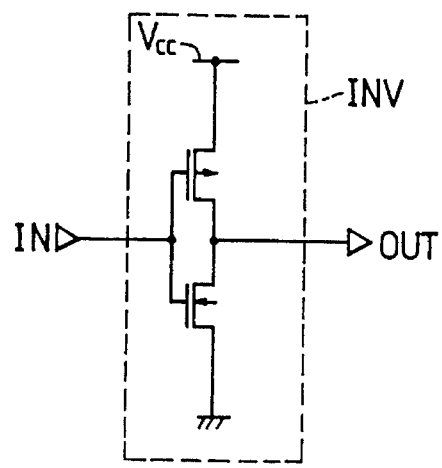

FIG. 22 shows a circuit wherein a complementary MOS (hereinafter abbreviated as CMOS) inverter circuit INV shown in FIG. 24 is inserted into the rear stage of the differential amplifier DA shown in FIG. 21. Since the phase of an output is thereby inverted, an input to DA is inverted herein to the one of FIG. 21.

The present embodiment is characterized in that a gain of a control signal generator is increased by the inverter circuit. Thereby differences among VL, $VF_1$, $VF_2$ and $VF_3$ can be made small, and therefore the amount of variation of VL0 can be lessened. In addition, an output voltage of the amplifier is turned to be $V_{CC}$ at High level and $V_{ss}$ at Low level by the CMOS inverter circuit. Therefore the current controlling transistors $Q_{50}$, $Q_{51}$, $Q_{52}$ can be turned ON and OFF completely, and thereby a still further power reduction can be attained.

While MIS LSI is taken as an example in the above description of the present invention, the same effect can be produced also for bipolar LSI or Bi-CMOS LSI wherein the above two types of LSI are integrated.

According to the fourth to seventh embodiments described above, the differential amplifier of the voltage limiter circuit can make a large current flow even when the input voltage thereof becomes equal to a supply voltage. This enables the realization of the voltage limiter circuit which operates at high speed even when the supply voltage lowers and becomes equal to the output voltage of the voltage limiter.

Besides, these embodiments enable the fine control of drivability in accordance with the state of a load, and therefore power reduction can be attained.

We claim:

1. A semiconductor memory comprising:

a memory cell having a first MOS transistor;

a data line coupled to a drain or a source of the first MOS transistor;

a word line coupled to a gate of the first MOS transistor; and a voltage converter for converting an external supply voltage which is supplied from outside of said semiconductor memory, into an internal supply voltage which is supplied to said data line, wherein said voltage converter comprises:
- a first circuit for supplying a first reference voltage whose magnitude has a predetermined dependence on a magnitude of the external supply voltage when the external supply voltage is larger than a predetermined voltage;
- a second circuit for supplying a second reference voltage whose magnitude has a greater dependence on the magnitude of the external supply voltage than the predetermined dependence of the magnitude of the first reference voltage; and
- a third circuit coupled to receive both the first reference voltage and the second reference voltage, for outputting a voltage in proportion to a larger one of the first reference voltage and the second reference voltage.

2. The semiconductor memory according to claim 1, wherein said third circuit further comprises
- a comparator which compares the first reference voltage with the second reference voltage to generate a comparison output; and
- a switch for connecting either one of the first reference voltage and the second reference voltage to an output terminal in accordance with the comparison output of said comparator.

3. The semiconductor memory according to claim 1, wherein said third circuit further comprises:
- a node;
- a second MOS transistor having a source-drain path coupled between the external supply voltage and said node;
- a third MOS transistor having a source-drain path coupled between the external supply voltage and said node;
- a first differential amplifier having an output coupled to a gate of said second MOS transistor;
- a second differential amplifier having an output coupled to a gate of said third MOS transistor; and
- a buffer coupled between said node and said data line,
- wherein an inverting input of said first differential amplifier is coupled to receive said first reference voltage,
- wherein an inverting input of said second differential amplifier is coupled to receive said second reference voltage, and
- wherein both a non-inverting input of said first differential amplifier and a non-inverting input of said second differential amplifier are coupled to said node.

4. The semiconductor memory according to claim 3, wherein said third circuit further comprises a current source coupled to said node.

5. The semiconductor memory according to claim 3, wherein said third circuit further comprises a voltage dividing means coupled between said node and said non-inverting input of said first differential amplifier.

6. The semiconductor memory according to claim 3, wherein said third circuit further comprises a voltage dividing means coupled between said node and said non-inverting input of said second differential amplifier.

7. The semiconductor memory according to claim 3, further comprising a sense amplifier coupled between said node and said data line.

8. A semiconductor memory according to claim 7, wherein said semiconductor memory is a random access memory.

9. A semiconductor memory according to claim 8, wherein said semiconductor memory is a dynamic random access memory.

10. The semiconductor memory according to claim 3, further comprising a precharge circuit coupled between said node and said data line.

11. The semiconductor memory according to claim 10, further comprising a voltage generating circuit, coupled between said node and said precharge circuit, for generating a voltage proportional to said internal supply voltage.

12. A semiconductor memory according to claim 11, wherein said semiconductor memory is a random access memory.

13. A semiconductor memory according to claim 12, wherein said semiconductor memory is a dynamic random access memory.

14. A semiconductor memory comprising:
- a memory cell having a first MOS transistor;
- a data line coupled to a drain or a source of the first MOS transistor;
- a word line coupled to a gate of the first MOS transistor; and
- a voltage converter for converting an external supply voltage which is supplied from outside of said semiconductor memory, into an internal supply voltage, wherein said voltage converter comprises:
- a first circuit for supplying a first reference voltage whose magnitude has a predetermined dependence on a magnitude of the external supply voltage when the external supply voltage is larger than a predetermined voltage;
- a second circuit for supplying a second reference voltage whose magnitude has a greater dependence on the magnitude of the external supply voltage than the predetermined dependence of the magnitude of the first reference voltage;
- a third circuit coupled to receive both the first reference voltage and the second reference voltage, for outputting a voltage in proportion to a larger one of the first reference voltage and the second reference voltage; and
- a word line booster coupled between an output of said third circuit and said word line for boosting said internal supply voltage to a boosted voltage having a magnitude which is a predetermined amount larger than the magnitude of said internal supply voltage.

15. The semiconductor memory according to claim 14, wherein said third circuit further comprises:
- a comparator which compares the first reference voltage with the second reference voltage to generate a comparison output; and
- a switch for connecting either one of the first reference voltage and the second reference voltage to an output terminal in accordance with the comparison of said comparator.

16. The semiconductor memory according to claim 14, wherein said third circuit further comprises:
- a node;
- a second MOS transistor having a source-drain path coupled between the external supply voltage and said node;
- a third MOS transistor having a source-drain path coupled between the external supply voltage and said node;
- a first differential amplifier having an output coupled to a gate of said second MOS transistor;

a second differential amplifier having an output coupled to a gate of said third MOS transistor; and a buffer coupled between said node and said word line booster, wherein an inverting input of said first differential amplifier is coupled to receive said first reference voltage, wherein an inverting input of said second differential amplifier is coupled to receive a second reference voltage, and wherein both a non-inverting input of said first differential amplifier and a non-inverting input of said second differential amplifier are coupled to said node.

17. A semiconductor memory according to claim 16, wherein said semiconductor memory is a random access memory.

18. A semiconductor memory according to claim 17, wherein said semiconductor memory is a dynamic random access memory.

19. The semiconductor memory according to claim 14, wherein said third circuit further comprises a current source coupled to said node.

20. The semiconductor memory according to claim 14, wherein said third circuit further comprises a voltage dividing means coupled between said node and said non-inverting input of said first differential amplifier.

21. The semiconductor memory according to claim 14, wherein said third circuit further comprises a voltage dividing means between said node and said non-inverting input of said second differential amplifier.

* * * * *